(12) United States Patent
Dong et al.

(10) Patent No.: US 11,671,093 B2
(45) Date of Patent: Jun. 6, 2023

(54) DRIVING DEVICE AND CONTROL METHOD

(71) Applicant: Delta Electronics (Shanghai) Co., Ltd., Shanghai (CN)

(72) Inventors: Jie Dong, Shanghai (CN); Zhenqing Xu, Shanghai (CN); Weiqiang Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/655,367

(22) Filed: Mar. 18, 2022

(65) Prior Publication Data

US 2022/0311434 A1   Sep. 29, 2022

(30) Foreign Application Priority Data

Mar. 25, 2021   (CN) .......................... 202110322065.8

(51) Int. Cl.
*H03K 17/04* (2006.01)
*H03K 17/041* (2006.01)
*H03K 17/567* (2006.01)
*H03K 17/687* (2006.01)
*H02M 1/08* (2006.01)
*H02M 3/158* (2006.01)
*H02M 3/337* (2006.01)
*H03K 17/06* (2006.01)

(52) U.S. Cl.
CPC .......... *H03K 17/687* (2013.01); *H02M 3/337* (2013.01); *H03K 17/04106* (2013.01); *H03K 17/06* (2013.01); *H03K 2217/009* (2013.01)

(58) Field of Classification Search
None
See application file for complete search history.

(56) References Cited

U.S. PATENT DOCUMENTS 4,866,349 A * 9/1989 Weber .................... G09G 3/297
315/169.3
5,010,261 A * 4/1991 Steigerwald ..... H03K 17/04163
327/434

(Continued)

FOREIGN PATENT DOCUMENTS

CN            1561576 B      3/2013

*Primary Examiner* — Kenneth B Wells
(74) *Attorney, Agent, or Firm* — CKC & Partners Co., LLC

(57) ABSTRACT

The present invention provides a driving device and a control method. The driving device is configured to drive a power switch and includes a power supply, a first bridge arm coupled to the power supply, a second bridge arm coupled in parallel to the first bridge arm, and a resonant inductor. The first bridge arm includes a first switch and a second switch connected to a first midpoint, the second bridge arm comprises a first semiconductor element and a second semiconductor element connected to a second midpoint, and the resonant inductor is coupled between the first midpoint and the second midpoint. The control method includes turning on the first switch for a first period such that the power supply charges a gate electrode of the power switch; and in response to a decrease of a current of the resonant inductor to a first threshold value, turning on the first switch again for a second period such that a potential of the first midpoint is equal to a potential of the second midpoint.

23 Claims, 15 Drawing Sheets

(56) References Cited

U.S. PATENT DOCUMENTS

| | | | | |
|---|---|---|---|---|
| 5,081,400 A * | 1/1992 | Weber | G09G 3/2986 | 345/204 |
| 5,204,561 A * | 4/1993 | Rischmuller | H03K 17/687 | 327/32 |
| 5,264,736 A * | 11/1993 | Jacobson | H03K 17/04123 | 327/365 |
| 5,438,290 A * | 8/1995 | Tanaka | G09G 3/2965 | 327/108 |
| 5,642,018 A * | 6/1997 | Marcotte | G09G 3/2965 | 315/169.3 |
| 5,670,974 A * | 9/1997 | Ohba | G09G 3/2965 | 345/60 |
| 5,994,929 A * | 11/1999 | Sano | G09G 3/2965 | 327/110 |
| 6,111,556 A * | 8/2000 | Moon | G09G 3/2965 | 345/60 |
| 6,150,999 A * | 11/2000 | Chen | G09G 3/2965 | 345/60 |
| 6,175,192 B1 * | 1/2001 | Moon | G09G 3/2965 | 315/169.3 |
| 6,441,673 B1 | 8/2002 | Zhang | | |
| 6,650,169 B2 * | 11/2003 | Faye | H03K 17/04123 | 327/427 |
| 6,650,551 B1 * | 11/2003 | Melgarejo | H02M 3/01 | 363/16 |
| 6,788,033 B2 * | 9/2004 | Vinciarelli | H02M 3/1582 | 323/225 |
| 7,053,869 B2 * | 5/2006 | Choi | G09G 3/293 | 345/60 |
| 7,091,753 B2 * | 8/2006 | Inoshita | H02M 1/08 | 327/108 |
| 7,285,876 B1 * | 10/2007 | Jacobson | H02M 1/088 | 307/127 |
| 7,327,334 B2 * | 2/2008 | Chen | G09G 3/2965 | 345/63 |
| 7,339,558 B2 * | 3/2008 | Chen | G09G 3/2965 | 345/63 |
| 7,348,941 B2 * | 3/2008 | Chen | G09G 3/2965 | 345/63 |
| 7,352,343 B2 * | 4/2008 | Park | G09G 3/2965 | 315/169.3 |
| 7,365,579 B2 * | 4/2008 | Kimura | H03K 17/168 | 327/112 |
| 7,403,200 B2 * | 7/2008 | Abdoulin | G09G 3/2965 | 327/108 |
| 7,459,945 B2 * | 12/2008 | Omura | H03K 17/04123 | 327/108 |
| 7,479,935 B2 * | 1/2009 | Choi | G09G 3/294 | 345/60 |
| 7,525,517 B2 * | 4/2009 | Choi | G09G 3/293 | 345/60 |
| 7,598,792 B2 * | 10/2009 | Liu | H02M 3/3376 | 327/494 |
| 7,602,229 B2 * | 10/2009 | Tolle | H03K 17/04123 | 327/108 |
| 7,612,602 B2 * | 11/2009 | Yang | H02M 1/08 | 327/494 |
| 7,633,464 B2 * | 12/2009 | Mima | G09G 3/294 | 345/60 |
| 8,085,083 B2 * | 12/2011 | Zhang | H03K 17/145 | 327/427 |
| 8,111,052 B2 * | 2/2012 | Glovinsky | H02M 3/158 | 323/225 |
| 8,519,750 B2 * | 8/2013 | Kimura | H03K 17/04123 | 327/423 |
| 8,599,578 B2 * | 12/2013 | Worek | H02M 3/335 | 363/21.02 |
| 8,847,631 B2 * | 9/2014 | Tao | H03K 17/04123 | 327/392 |
| 9,325,247 B1 * | 4/2016 | Vinciarelli | H02M 3/33507 | |
| 9,450,517 B2 * | 9/2016 | Kusama | H02M 7/537 | |
| 9,584,109 B2 * | 2/2017 | Tang | H03K 17/74 | |
| 9,793,794 B2 * | 10/2017 | Stauth | H02M 3/07 | |
| 10,050,619 B1 * | 8/2018 | Sjoroos | H03K 19/17708 | |
| 10,211,827 B2 * | 2/2019 | Yang | B60L 50/51 | |
| 10,355,688 B2 * | 7/2019 | Brown | H03K 17/687 | |
| 10,500,959 B2 * | 12/2019 | Yang | H03K 17/0406 | |
| 10,530,173 B2 * | 1/2020 | Sun | H02J 5/00 | |
| 11,011,970 B2 * | 5/2021 | Okawauchi | H02M 1/08 | |
| 11,482,918 B2 * | 10/2022 | Okawauchi | H02M 3/158 | |
| 2015/0138858 A1 | 5/2015 | Kusama et al. | | |
| 2019/0173465 A1 | 6/2019 | Brown et al. | | |

\* cited by examiner

DRIVING DEVICE AND CONTROL METHOD

CROSS-REFERENCE TO RELATED APPLICATIONS

This non-provisional application claims priority under 35 U.S.C. § 119(a) on Patent Application No. 202110322065.8 filed in P.R. China on Mar. 25, 2021, the entire contents of which are hereby incorporated by reference.

BACKGROUND OF THE INVENTION

1. Field of the Invention

The invention relates to a power electronics device, and particularly to a driving device and a control method.

2. Related Art

As a development of a power unit of a solid state transformer (SST), a frequency is increased in order to achieve high efficiency and high power density. Increasing a switching frequency is effective for achieving high power density, and fewer number of turns can be used in a high frequency to reduce a dimension and loss of windings of the transformer, thereby leaving more space for insulation.

Driving loss of a power switch of a high frequency power converter is increased linearly along with rising of the frequency. A ratio of the driving loss to a total loss is increased under a light load, and the issue of the driving loss is more significant. When the frequency is further increased, the ratio of the driving loss to the total loss becomes unacceptable, so the driving loss of a gate electrode of the power switch must be reduced.

Generally, the power output is performed by using a push-pull circuit, which mainly controls on and off of the power switch by controlling a gate voltage of the power switch. FIG. 1 shows a topological structure of a push-pull circuit applied in a conventional driving method. When the switch $S_1$ is turned on, and the switch $S_2$ is turned off, a power supply $V_{DD}$ charges a gate capacitor $C_{gs}$ of the power switch Q through the switch $S_1$, a gate external resistor $R_{g\text{-}ex}$ and an internal resistor $R_{g\text{-}in}$, and the gate voltage is increased, thereby turning on the power switch Q. When the switch $S_2$ is turned on, and the switch $S_1$ is turned off, the gate capacitor $C_{gs}$ is discharged to a power supply $V_{EE}$ through the internal resistor $R_{g\text{-}in}$, the gate external resistor $R_{g\text{-}ex}$ and the switch $S_2$, and the gate voltage is decreased, thereby turning off the power switch Q. In the conventional driving method, the driving loss is:

$$P_{gating} = Q_g \times V_{gs} \times f_s$$

wherein $Q_g$ is a gate charge of the power switch Q, $V_{gs}$ is a voltage between a gate electrode G and a source electrode S of the power switch Q, and $f_s$ is a switching frequency of the power switch Q.

As can be seen from the formula, in the conventional driving method, the driving loss $P_{gating}$ is proportional to the switching frequency $f_s$. With an increase of the switching frequency $f_s$, the driving loss $P_{gating}$ is significantly increased.

The conventional driving method is characterized by: (1) outputting power using the push-pull circuit; and (2) controlling a switching speed of the power switch Q by the gate external driving resistor $R_{g\text{-}ex}$. However, the conventional driving method has the following disadvantages: (1) the driving loss is high and proportional to the switching frequency, and the high frequency dramatically increases the loss; and (2) a ratio of the driving loss to the total loss is increased under a light load.

There is also a lossless driving method in the prior art, as shown in FIGS. 2A and 2B. In the lossless driving method, a resonant inductor $L_r$ and diodes $D_1$, $D_2$ are added on the basis of push-pull output.

At a time $t_0$, the switch $S_1$ is turned on, the power supply $V_{DD}$ charges the gate capacitor $C_{gs}$ of the power switch Q through the switch $S_1$, the resonant inductor $L_r$ and the internal resistor $R_{g\text{-}in}$, the gate voltage is increased, and turning on of the power switch Q is initiated.

At a time $t_1$, the gate voltage is increased to VDD, and the power switch Q is stably turned on. As shown in FIG. 2C, the switch $S_1$ is turned off, the diode $D_1$ is turned on, and a current of the resonant inductor is freewheeled through the diode $D_1$ and a body diode of the switch $S_2$ until the current is zero, such that the energy is fed back to the power supply to reduce the loss.

At times $t_1$-$t_3$, the power switch Q is stably turned on, and the switches $S_1$ and $S_2$ are maintained turned off.

At the time $t_3$, the switch $S_2$ is turned on, the gate capacitor $C_{gs}$ is discharged to the power supply $V_{EE}$ through the internal resistor $R_{g\text{-}in}$, the resonant inductor $L_r$ and the switch $S_2$, the gate voltage is decreased, and turning off of the power switching Q is initiated.

At the time $t_4$, the gate voltage is decreased to VEE, the power switch Q is completely turned off, the switch $S_2$ is turned off, and the diode $D_2$ is turned on. The current of the resonant inductor is freewheeled through the diode $D_2$ and a body diode of the switch $S_1$ until the current is zero, such that energy is fed back to the power supply to reduce the loss.

However, the lossless driving method has the following problems: at the time $t_2$, the current of the resonant inductor is decreased to zero, and since potentials of the two nodes a and b are different ($V_a \approx V_{EE}$, $V_b \approx V_{DD}$), a direction of the current of the resonant inductor is reversed due to the voltage difference, causing an oscillation occurring on a parasitic capacitance of the switches $S_1$, $S_2$ and the diodes $D_1$, $D_2$, as shown in FIG. 3A. FIG. 3B shows an equivalent circuit of an LC oscillation circuit. The driving voltage will drop due to the oscillation. As for a switch with the driving voltage of +15V/−5V, the driving voltage may change from −5V to 0V when it is turned off, so the switch cannot be turned off reliably, and may be triggered by error. Moreover, the drop of the driving voltage increases a turn-on resistance of the power switch. As shown in FIGS. 3C and 3D, the driving voltage drops from 15V to 13V, the turn-on resistance is increased from 45 mΩ to 70 mΩ, and the turn-on loss under the same current is increased, such that system efficiency is reduced.

The lossless driving method is characterized by: (1) the current of the resonant inductor $L_r$ is freewheeled through the diode, and the energy is fed back to the power supply to reduce the loss; (2) the resonant inductor $L_r$ is configured to control a switching speed; and (3) partial loss in the driving circuit is irrelevant to the switching frequency $f_s$, so the loss in a high frequency is further reduced. However, the lossless driving method has the following disadvantages: (1) oscillation occurs during switching, and the drop-out of the gate voltage increases the possibility of error trigger and reduces the reliability of the gate electrode; and (2) the drop-out of the gate voltage increases the turn-on resistance, and thus the turn-on loss is significantly increased.

Therefore, a lossless driving method that can suppress the oscillation is required.

SUMMARY OF THE INVENTION

An object of the invention is to provide a driving device and a control method, which can solve one or more deficiencies in the prior art.

To achieve the above object, according to one embodiment of the invention, the invention provides a method for controlling a driving device. The driving device is configured to drive a power switch and includes a power supply, a first bridge arm coupled to the power supply, a second bridge arm coupled in parallel to the first bridge arm, and a resonant inductor, the first bridge arm includes a first switch and a second switch connected to a first midpoint, the second bridge arm includes a first semiconductor element and a second semiconductor element connected to a second midpoint, and the resonant inductor is coupled between the first midpoint and the second midpoint. And the method includes: turning on the first switch for a first period such that the power supply charges a gate electrode of the power switch; and turning on the first switch again for a second period in response to a decrease of a current of the resonant inductor to a first threshold value, thereby a potential of the first midpoint being equal to a potential of the second midpoint.

In one embodiment of the invention, the method further includes: turning on the second switch for a third period to discharge the gate electrode of the power switch; and turning on the second switch again for a fourth period in response to an increase the current of the resonant inductor to a second threshold value, thereby the potential of the first midpoint being equal to the potential of the second midpoint.

In one embodiment of the invention, the power supply includes a first power supply coupled to the first switch and a second power supply coupled to the second switch, in the second period, the potential of the first midpoint is clamped by the first switch to a voltage of the first power supply, and the potential of the second midpoint is equal to the voltage of the first power supply, and in the fourth period, the potential of the first midpoint is clamped by the second switch to a voltage of the second power supply, and the potential of the second midpoint is equal to the voltage of the second power supply.

In one embodiment of the invention, the first switch turned on again is turned off when the current of the resonant inductor is decreased to zero, and the second switch turned on again is turned off when the current of the resonant inductor is increased to zero.

In one embodiment of the invention, the first switch turned on again is turned off before the second switch is turned on, and the second switch turned on again is turned off before the first switch is turned on in a next switching period.

In one embodiment of the invention, the method further includes: calculating a time $t_{\alpha 1}$ at which the current of the resonant inductor is decreased to the first threshold value according to a first inductance-current formula; calculating a time $t_{\beta 1}$ at which the current of the resonant inductor is decreased to zero according to a second inductance-current formula; calculating a time $t_{\mu 1}$ at which the second switch is turned on according to a duty cycle and a switching frequency of the power switch; turning on the first switch again when a time counted by an internal timer is equal to the time $t_{\alpha 1}$; and turning off the first switch when the time counted by the internal timer is a time in $[t_{\beta 1}, t_{\mu 1})$.

In one embodiment of the invention, the method further includes: calculating a time $t_{\alpha 2}$ at which the current of the resonant inductor is increased to the second threshold value according to a third inductance-current formula; calculating a time $t_{\beta 2}$ at which the current of the resonant inductor is increased to zero according to a fourth inductance-current formula; determining an ending time $t_s$ of a current switching period; turning on the second switch again when a time counted by an internal timer is equal to the time $t_{\alpha 2}$; and turning off the second switch when the time counted by the internal timer is a time in $[t_{\beta 2}, t_s)$.

In one embodiment of the invention, the method further includes: obtaining the current of the resonant inductor; comparing an obtained value with the first threshold value, and turning on the first switch again when the obtained value is equal to the first threshold value; and comparing the obtained value with zero, and turning off the first switch when the obtained value is equal to zero.

In one embodiment of the invention, the method further includes: obtaining the current of the resonant inductor; comparing an obtained value with the first threshold value, and turning on the first switch again when the obtained value is equal to the first threshold value; comparing the obtained value with zero, and recording a time $t_{\beta 1}$ counted by an internal timer when the obtained value is equal to zero; and obtaining a turn-on time $t_{\mu 1}$ of the second switch, and turning off the first switch when the time counted by the internal timer is a time in $(t_{\beta 1}, t_{\mu 1})$.

In one embodiment of the invention, the method further includes: obtaining the current of the resonant inductor; comparing an obtained value with the second threshold value, and turning on the second switch again when the obtained value is equal to the second threshold value; and comparing the obtained value with zero, and turning off the second switch when the obtained value is equal to zero.

In one embodiment of the invention, the method further includes: obtaining the current of the resonant inductor; comparing an obtained value with the second threshold value, and turning on the second switch again when the obtained value is equal to the second threshold value; comparing the obtained value with zero, and recording a time $t_{\beta 2}$ counted by an internal timer when the obtained value is equal to zero; and obtaining an ending time $t_s$ of a current switching period, and turning off the second switch when the time counted by the internal timer is a time in $(t_{\beta 2}, t_s)$.

In one embodiment of the invention, the first threshold value is in a range of $(0, 1 \text{ A}]$, and the second threshold value is in a range of $[-1 \text{ A}, 0)$.

To achieve the above object, according to another embodiment of the invention, the invention further provides a device for driving a power switch. The device includes: a power supply; a first bridge arm coupled to the power supply and including a first switch and a second switch connected to a first midpoint; a second bridge arm coupled in parallel to the first bridge arm and including a first semiconductor element and a second semiconductor element connected to a second midpoint; and a resonant inductor coupled between the first midpoint and the second midpoint, wherein the first switch is turned on for a first period such that the power supply charges a gate electrode of the power switch; and the first switch is turned on again for a second period in response to a decrease of a current of the resonant inductor to a first threshold value, such that a potential of the first midpoint is equal to a potential of the second midpoint.

In another embodiment of the invention, the second switch is turned on for a third period to discharge the gate electrode of the power switch; and the second switch is turned on again for a fourth period in response to an increase of the current of the resonant inductor to a second threshold value, such that the potential of the first midpoint is equal to the potential of the second midpoint.

In another embodiment of the invention, the power supply includes a first power supply coupled to the first switch and a second power supply coupled to the second switch, in the second period, the potential of the first midpoint is clamped by the first switch to a voltage of the first power supply, and the potential of the second midpoint is equal to the voltage of the first power supply, and in the fourth period, the potential of the first midpoint is clamped by the second switch to a voltage of the second power supply, and the potential of the second midpoint is equal to the voltage of the second power supply.

In another embodiment of the invention, the first switch turned on again is turned off when the current of the resonant inductor is decreased to zero, and the second switch turned on again is turned off when the current of the resonant inductor is increased to zero.

In another embodiment of the invention, the first switch turned on again is turned off before the second switch is turned on, and the second switch turned on again is turned off before the first switch is turned on in a next switching period.

In another embodiment of the invention, the device further includes a control unit electrically connected to the first switch and the second switch and configured to: calculate a time $t_{\alpha 1}$ at which the current of the resonant inductor is decreased to the first threshold value according to a first inductance-current formula; calculate a time $t_{\beta 1}$ at which the current of the resonant inductor is decreased to zero according to a second inductance-current formula; calculate a time $t_{\mu 1}$ at which the second switch is turned on according to a duty cycle and a switching frequency of the power switch; turn on the first switch again when a time counted by an internal timer is equal to the time $t_{\alpha 1}$; and turn off the first switch when the time counted by the internal timer is a time in $[t_{\beta 1}, t_{\mu 1})$.

In another embodiment of the invention, the device further includes a control unit electrically connected to the first switch and the second switch and configured to: calculate a time $t_{\alpha 2}$ at which the current of the resonant inductor is increased to the second threshold value according to a third inductance-current formula; calculate a time $t_{\beta 2}$ at which the current of the resonant inductor is increased to zero according to a fourth inductance-current formula; determine an ending time $t_8$ of a current switching period; turn on the second switch again when a time counted by an internal timer is equal to the time $t_{\alpha 2}$; and turn off the second switch when the time counted by the internal timer is a time in $[t_{\beta 2}, t_8)$.

In another embodiment of the invention, the device further includes a control unit electrically connected to the first switch and the second switch, and a sampling unit electrically connected to the resonant inductor and the control unit, wherein, the sampling unit is configured to obtain the current of the resonant inductor; and the control unit is configured to: receive an obtained value; compare the obtained value with the first threshold value, and turn on the first switch again when the obtained value is equal to the first threshold value; and compare the obtained value with zero, and turn off the first switch when the obtained value is equal to zero.

In another embodiment of the invention, the device further includes a control unit electrically connected to the first switch and the second switch, and a sampling unit electrically connected to the resonant inductor and the control unit, wherein, the sampling unit is configured to obtain the current of the resonant inductor; and the control unit is configured to: receive an obtained value; compare the obtained value with the first threshold value, and turn on the first switch again when the obtained value is equal to the first threshold value; compare the obtained value with zero, and record a time $t_{\beta 1}$ counted by an internal timer when the obtained value is equal to zero; and obtain a turn-on time $t_{\mu 1}$ of the second switch, and turn off the first switch when the time counted by the internal timer is a time in $(t_{\beta 1}, t_{\mu 1})$.

In another embodiment of the invention, the device further includes a control unit electrically connected to the first switch and the second switch, and a sampling unit electrically connected to the resonant inductor and the control unit, wherein, the sampling unit is configured to obtain the current of the resonant inductor; and the control unit is configured to: receive an obtained value; compare the obtained value with the second threshold value, and turn on the second switch again when the obtained value is equal to the second threshold value; and compare the obtained value with zero, and turn off the second switch when the obtained value is equal to zero.

In another embodiment of the invention, the device further includes a control unit electrically connected to the first switch and the second switch, and a sampling unit electrically connected to the resonant inductor and the control unit wherein, the sampling unit is configured to obtain the current of the resonant inductor; and the control unit is configured to: receive an obtained value; compare the obtained value with the second threshold value, and turn on the second switch again when the obtained value is equal to the second threshold value; compare the obtained value with zero, and record a time $t_{\beta 2}$ counted by an internal timer when the obtained value is equal to zero; and obtain an ending time $t_8$ of a current switching period, and turn off the second switch when the time counted by the internal timer is a time in $(t_{\beta 2}, t_8)$.

The additional aspects and advantages of the invention are partially explained in the below description, and partially becoming apparent from the description, or can be obtained through the practice of the invention.

BRIEF DESCRIPTION OF THE DRAWINGS

The exemplary embodiments will be described in details with reference to the accompanying drawings, through which the above and other features and advantages of the invention will become more apparent.

DETAILED EMBODIMENTS OF THE INVENTION

Figure 1:
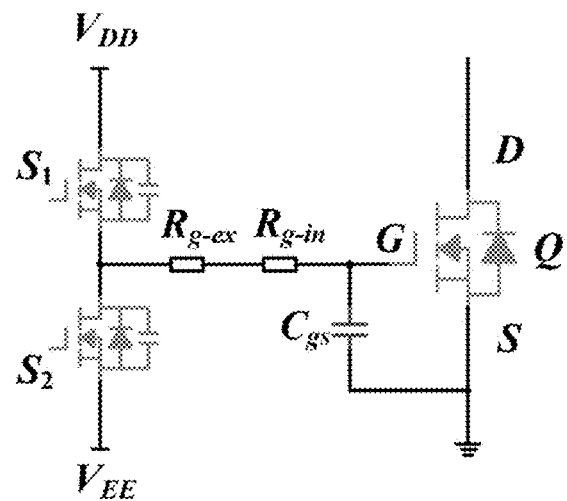
FIG. 1 shows a topological structure of a push-pull circuit applied in a conventional driving method.
Figure 2A:
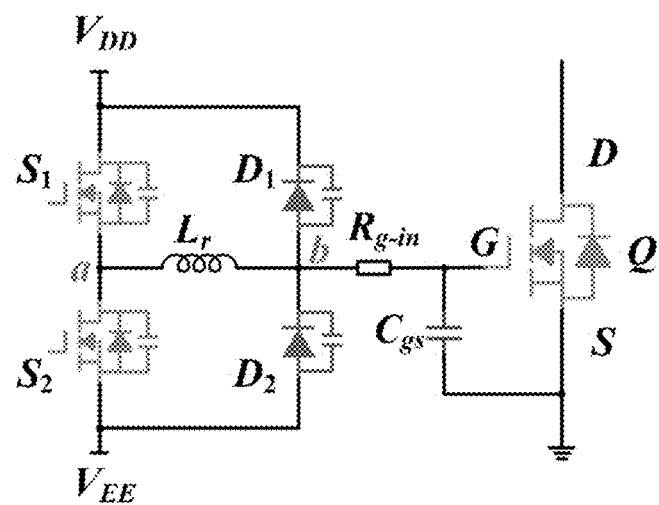
FIG. 2A shows a topological structure of a circuit applied in a conventional lossless driving method.
Figure 2B:
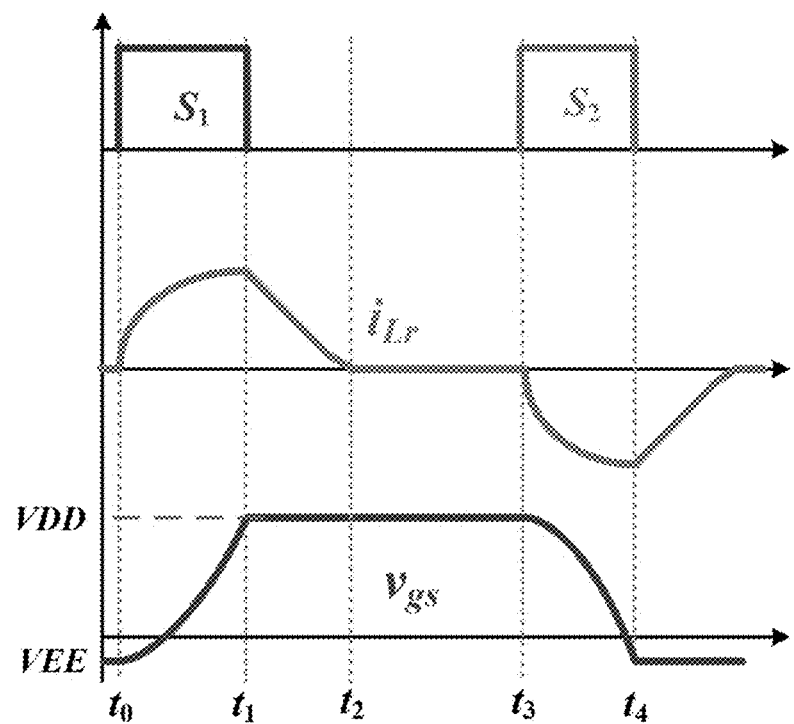
FIG. 2B shows working waveforms of the conventional lossless driving method.
Figure 2C:
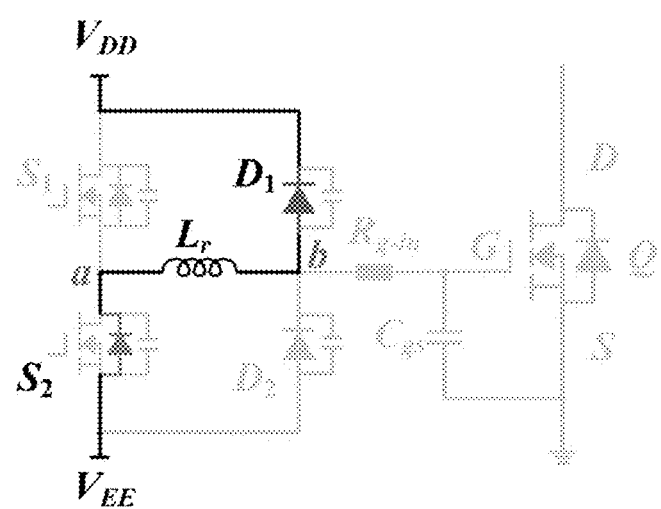
FIG. 2C shows states of switches at a time $t_1$ in the conventional lossless driving method.
Figure 3A:
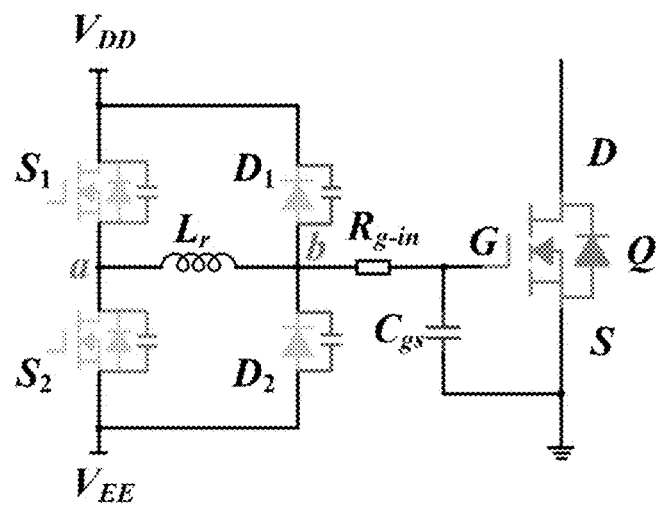
FIG. 3A shows a circuit structure where an oscillation occurs in a resonant inductor and a parasitic capacitance of switches $S_1$, $S_2$ and diodes $D_1$, $D_2$ at a time $t_2$ in the conventional lossless driving method.
Figure 3B:
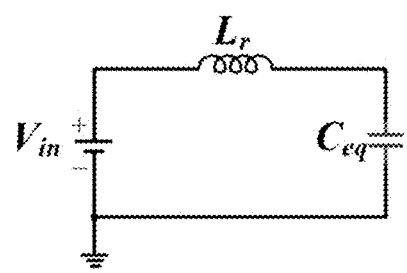
FIG. 3B shows an equivalent LC oscillation circuit of the structure of FIG. 3A.
Figure 3C:
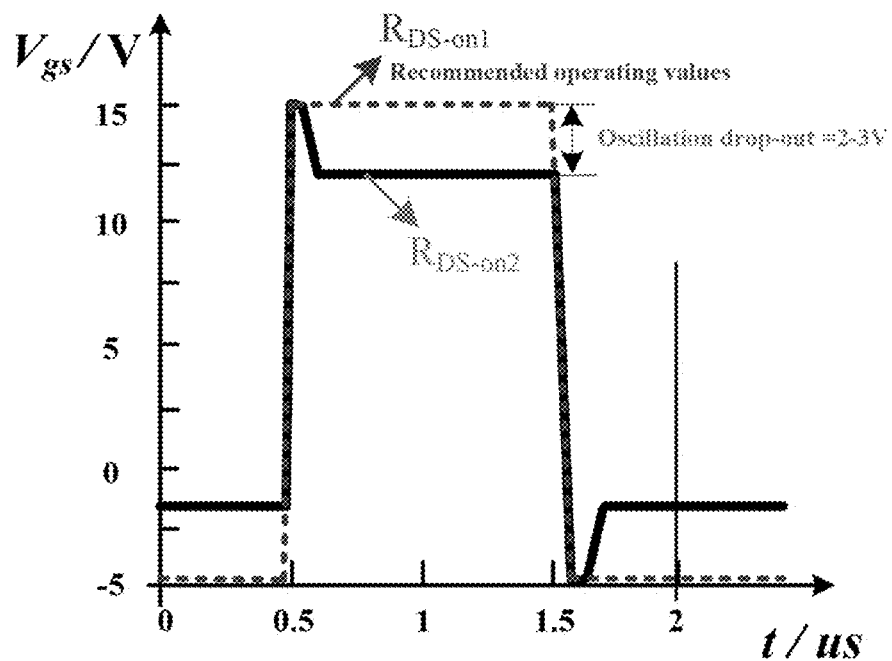
FIG. 3C shows a drop-out of a driving voltage resulting from the oscillation in the conventional lossless driving method.
Figure 3D:
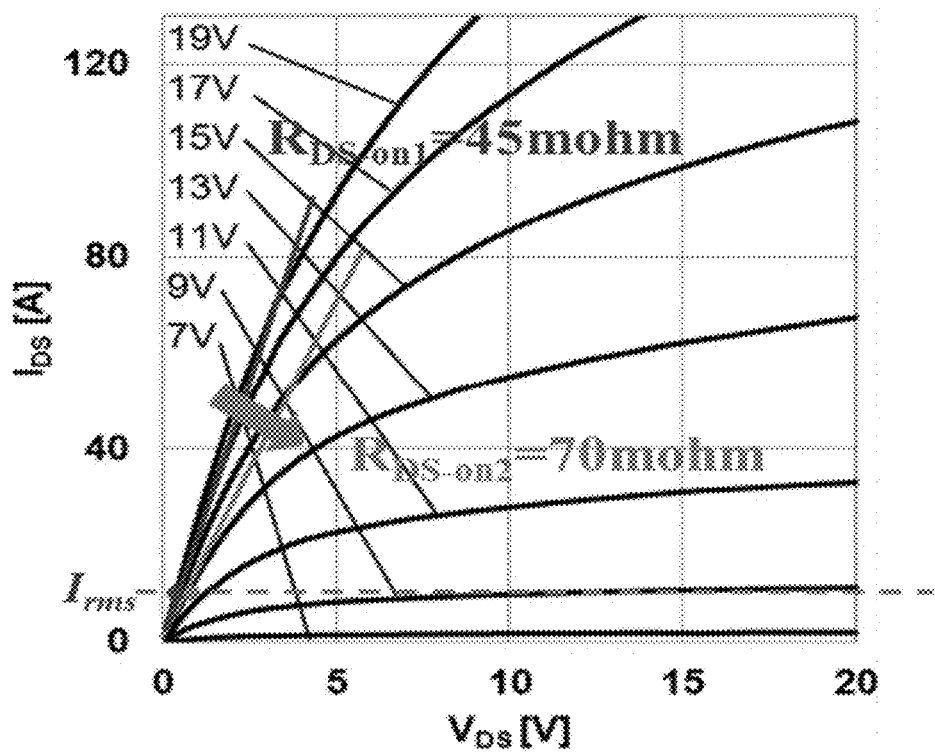
FIG. 3D shows a change of turn-on resistance resulting from the oscillation in the conventional lossless driving method.

The exemplary embodiments will be described more fully with reference to the accompanying drawings. However, the exemplary embodiments can be implemented in various forms and shall not be limited to the embodiments set forth herein; on the contrary, these embodiments are provided so that this invention will be thorough and complete, and the conception of exemplary embodiments will be fully conveyed to those skilled in the art. In the drawings, the same reference sign denotes the same or similar structure, so the detailed description will be omitted.

When elements and/of components described and/or illustrated here are introduced, the term "one", "a", "an", "the" and "at least one" refer to one or more elements and/or components. The terms "include", "comprise" and "have" refer to an open and included meaning, and additional elements and/or components may exist in addition to the listed element and/or component. The relative term, such as, "upper" or "lower" may be used to describe a relative relation between one component and another component. It shall be understood that if the device reverses to turn upside down, the component described as on an "upper" side will become a component on a "lower" side. In addition, the terms "first", "second" and the like in the claims are only used as signs, instead of numeral limitations to the object.

Figure 4A:
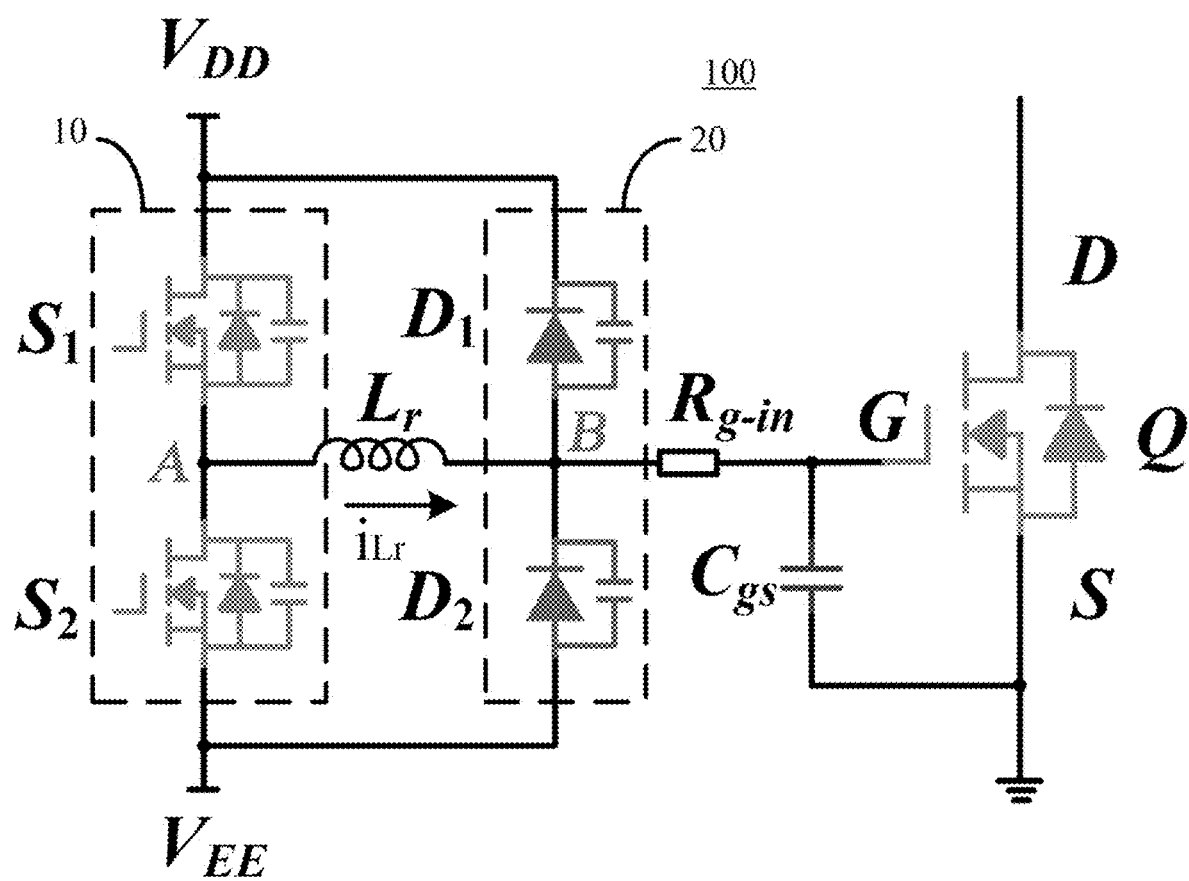
FIG. 4A shows a circuit topological structure of a driving device in a first preferable embodiment of the invention.

As shown in FIG. 4A, the invention provides a driving device 100 for driving a power switch Q. The power switch Q may have a gate electrode G, a source electrode S and a drain electrode D. The driving device 100 may include a power supply (e.g., a first power supply $V_{DD}$ and a second power supply $V_{EE}$), a first bridge arm 10, a second bridge arm 20 and a resonant inductor $L_r$. The first bridge arm 10 is coupled to the power supply, and includes a first switch $S_1$ and a second switch $S_2$ connected to a first midpoint A. For example, the first power supply $V_{DD}$ may be coupled to the first switch $S_1$, and the second power supply $V_{EE}$ may be coupled to the second switch $S_2$. The second bridge arm 20 is coupled in parallel to the first bridge arm 10, and includes a first semiconductor element and a second semiconductor element, such as diodes $D_1$ and $D_2$, connected to a second midpoint B. The resonant inductor $L_r$ is coupled between the first midpoint A and the second midpoint B. In other embodiment, the driving device 100 may only include the first power supply $V_{DD}$, and the second switch $S_2$ is grounded.

Figure 4B:
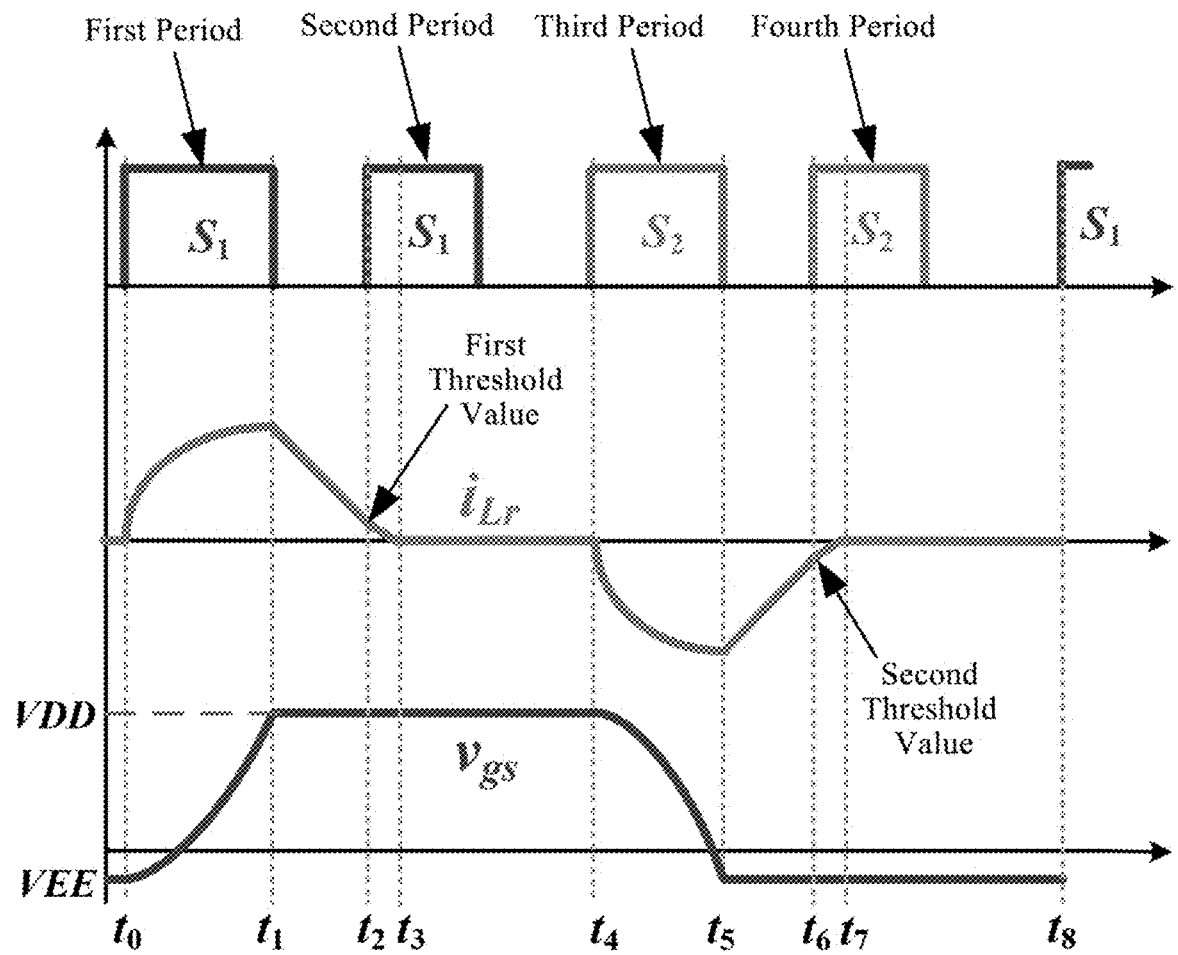
FIG. 4B shows working waveforms of the driving device of FIG. 4A.

Referring to FIG. 4B, the first switch $S_1$ is turned on for a first period, such that the power supply (the first power supply $V_{DD}$) charges a gate capacitor $C_{gs}$ of the power switch Q. In response to a decrease of a current of the resonant inductor $L_r$ to a first threshold value, the first switch $S_1$ is turned on again for a second period, such that a potential of the first midpoint A is equal to a potential of the second midpoint B. For example, in the second period, the potential of the first midpoint A may be clamped by the first switch $S_1$ to a voltage VDD of the first power supply $V_{DD}$, and the potential of the second midpoint B is equal to the voltage VDD of the first power supply $V_{DD}$. It shall be noted that "equal to" or "clamped" in this embodiment does not mean absolute equal, and allows a certain error.

Further, the second switch $S_2$ is turned on for a third period to discharge the gate capacitor $C_{gs}$ of the power switch Q. In response to an increase of the current of the resonant inductor $L_r$ to a second threshold value, the second switch $S_2$ is turned on again for a fourth period, such that the potential of the first midpoint A is equal to the potential of the second midpoint B. For example, in the fourth period, the potential of the first midpoint A is clamped by the second switch $S_2$ to a voltage VEE of the second power supply $V_{EE}$, and the potential of the second midpoint B is equal to the voltage VEE of the second power supply $V_{EE}$. It shall be noted that "equal to" or "clamped" in this embodiment does not mean absolute equal, and allows a certain error.

As shown in FIGS. 4A-4D, a method for controlling the driving device 100 to drive the power switch Q will be described.

At a time $t_0$, an upper switch (i.e., the first switch $S_1$) of the first bridge arm 10 is turned on, and an inductive current $i_{Lr}$ flows into a gate electrode G of the power switch Q. Due to an increase of the inductive current $i_{Lr}$, a gate voltage $V_{gs}$ of the power switch Q is increased, and the power switch Q is turned on.

At a time $t_1$, the gate voltage $V_{gs}$ of the power switch Q is increased to VDD, the power switch Q is stably turned on, the first switch $S_1$ of the first bridge arm 10 is turned off, the upper diode (i.e., the diode $D_1$) of the second bridge arm 20 is turned on, and the inductive current $i_{Lr}$ is freewheeled through the diode $D_1$ and a body diode of the second switch $S_2$.

Figure 4C:
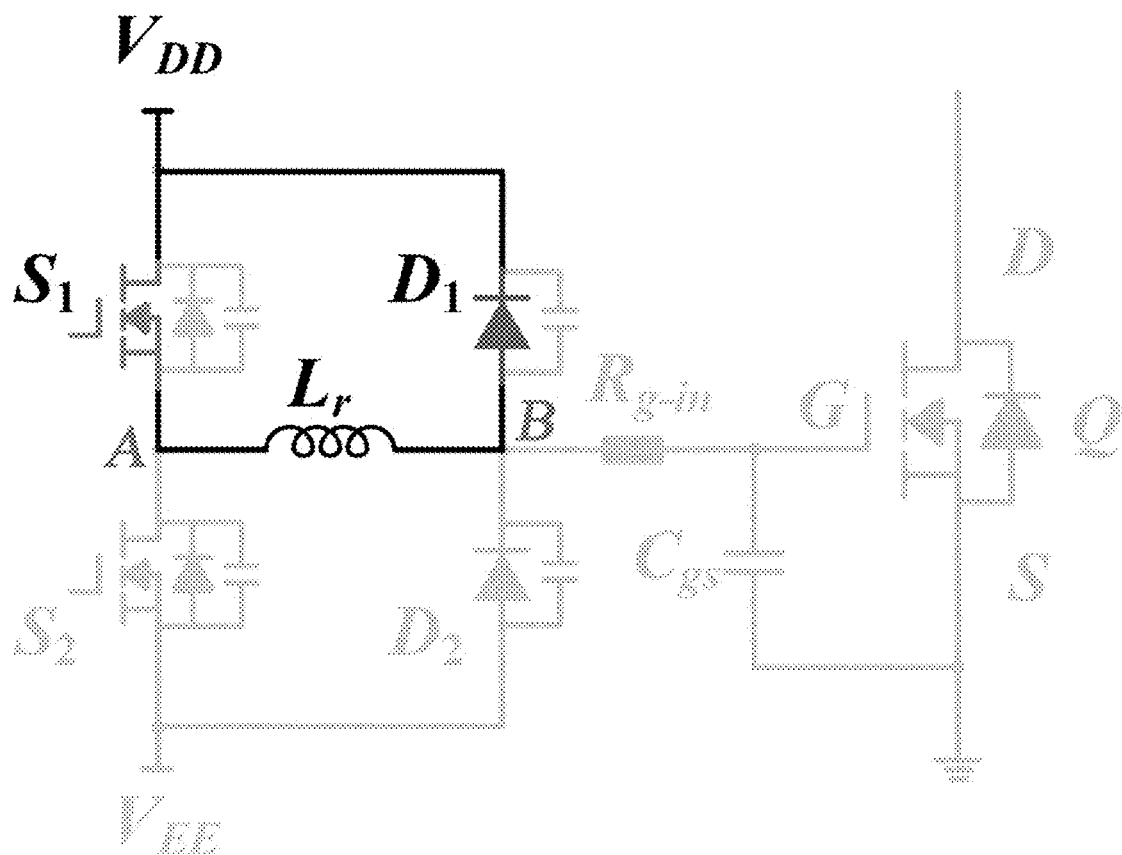
FIG. 4C shows a circuit state of the driving device according to the invention in which a first switch of a first bridge arm is turned on again for a second period in response to a decrease of a current of the resonant inductor to a first threshold value at a time $t_2$, such that a potential of a first midpoint a is equal to a potential of a second midpoint b.
Figure 4D:
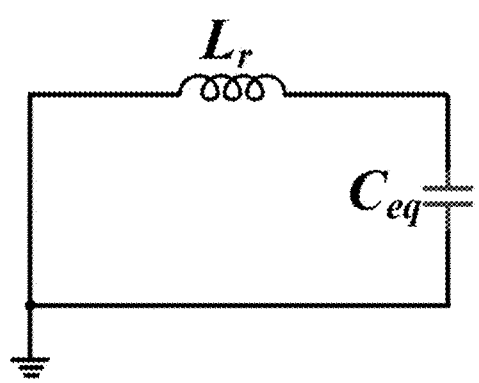
FIG. 4D shows an equivalent LC oscillation circuit of the circuit structure of FIG. 4C.

At a time $t_2$, the inductive current $i_{Lr}$ is decreased to a first threshold value close to zero, and the first switch $S_1$ of the first bridge arm 10 is turned on again. FIG. 4C shows a circuit state in which the inductive current is freewheeled through the first switch $S_1$ and the diode $D_1$. At this time, the voltages Va and Vb of the first midpoint A and the second midpoint B at opposite ends of the resonant inductor $L_r$ are approximately equal to VDD. There is no resonant source in the resonant network, and the oscillation does not occur. An equivalent circuit at time $t_2$ is shown in FIG. 4D.

At a time $t_3$, the current through the resonant inductor $L_r$ is decreased to zero, and the first switch $S_1$ of the first bridge arm 10 is turned off before the power switch Q is switched (i.e., at a turn-on time $t_4$ of the second switch).

Thereafter, the power switch Q will be turned off in a similar manner.

At a time $t_4$, a lower switch (i.e., the second switch $S_2$) of the first bridge arm 10 is turned on, and the current through the resonant inductor $L_r$ flows out of the gate electrode G of the power switch Q. Due to a decrease of the inductive current $i_{Lr}$, the gate voltage $V_{gs}$ of the power switch Q is decreased, and the power switch Q is turned off.

At a time $t_5$, the gate voltage $V_{gs}$ of the power switch Q is decreased to VEE, the power switch Q is stably turned off, the second switch $S_2$ of the first bridge arm 10 is turned off, a lower diode (i.e., the diode $D_2$) of the second bridge arm 20 is turned on, and the inductive current $i_{Lr}$ is freewheeled through the diode $D_2$ and a body diode of the switch $S_1$.

At a time $t_6$, the inductive current $i_{Lr}$ is increased to a second threshold value close to zero, and the second switch $S_2$ of the first bridge arm 10 is turned on again. At this time, the inductive current is freewheeled through the second switch $S_2$ and the diode $D_2$, the voltages Va and Vb of the first midpoint A and the second midpoint B at opposite ends of the resonant inductor $L_r$ are approximately equal to VEE. There is no resonant source in the resonant network, and the oscillation does not occur.

At a time $t_7$, the inductive current $i_{Lr}$ increased to zero, and the second switch $S_2$ of the first bridge arm 10 is turned off before the power switch Q is switched (i.e., before the first switch $S_1$ is turned on in a next switching period).

Figure 5:
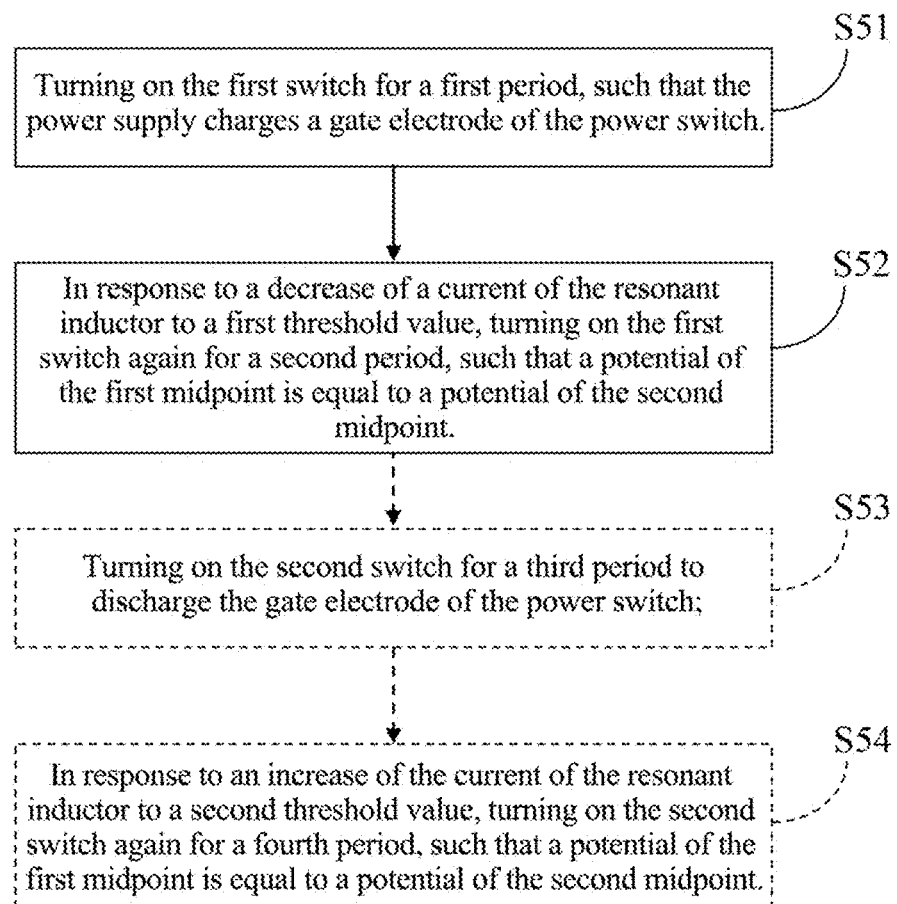
FIG. 5 shows a method for controlling a driving device according to the invention.

As shown in FIG. 5, a method for controlling a driving device of the invention may include steps S51 and S52. In the step S51, the first switch $S_1$ is turned on for a first period, such that the power supply (the first power supply $V_{DD}$) charges a gate electrode G of the power switch Q; and in the step S52, in response to a decrease of a current of the resonant inductor $L_r$ to a first threshold value, the first switch $S_1$ is turned on again for a second period, such that a potential of the first midpoint A is equal to a potential of the second midpoint B.

Preferably, the method for controlling the driving device of the invention may further include steps S53 and S54. In the step S53, the second switch $S_2$ is turned on for a third period to discharge the gate electrode G of the power switch Q; and in the step S54, in response to an increase of the current of the resonant inductor $L_r$ to a second threshold value, the second switch $S_2$ is turned on again for a fourth period, such that a potential of the first midpoint A is equal to a potential of the second midpoint B.

In this embodiment, when the current of the resonant inductor $L_r$ is decreased to a value close to zero, the first switch $S_1$ of the first bridge arm 10 is turned on again. Moreover, when the current of the resonant inductor $L_r$ is zero, the first switch $S_1$ turned on again is turned off; or the first switch $S_1$ turned on again is turned off before the power switch Q is switched. When the current of the resonant inductor $L_r$ is increased to a value close to zero, the second switch $S_2$ of the first bridge arm 100 is turned on again. Moreover, when the current of the resonant inductor $L_r$ is zero, the second switch $S_2$ turned on again is turned off; or the first switch $S_1$ turned on again is turned off before the power switch Q is switched. The power switch Q is switched when the first switch $S_1$ is turned on in a next switching period.

It shall be noted that, in order to describe conveniently, an arrow in FIG. 4A indicates a direction of a positive inductive current, and when the direction is opposite, the inductive current is negative, thereby obtaining an exemplary curve $i_{Lr}$ of the inductive current in FIG. 4B. Of course, the invention is not limited thereto, and the direction of the inductive current can be set according to actual requirement.

This embodiment has the advantage that the resistor is replaced by the resonant inductor through which a portion of energy is fed back to the power supply to reduce the loss of the driving circuit even in a high frequency, and the oscillation can be suppressed by changing the modulation manner of the lossless driving circuit without adding components, thereby reliably turning on and off the power switch without trigger error.

In the invention, in one switching period of the power switch Q, the square waves for driving the first switch $S_1$ and the second switch $S_2$ correspond to a high level in the first period, a high level in the second period, a high level in the third period, a high level in the fourth period, and a low level in remaining periods, so the square waves for driving the switches $S_1$ and $S_2$ can be obtained if initial times and termination times of the high levels can be calculated.

(Method 1) Times are obtained by mathematical calculation. The driving square wave generated from a controller (including but not limited to DSP/MCU/FPGA) has the corresponding high level or the low level. Referring to FIG. 4B, times $t_0$-$t_8$ correspond to one switching period T of the power switch, and the operations of the power switch Q, and the switches $S_1$ and $S_2$ are the same in multiple switching periods, so only the calculation for one switching period T will be described.

The duration of the first period can be set according to the model of the power switch Q and the desired switching speed (i.e., turn-on speed). That is, a length of the first period or the time $t_1$ can be set according to the requirement of the designer or the user. The time $t_0$ is an initial time of the switching period, and for convenience of understanding or description, the time $t_0$ can be considered to be zero. The controller initiates the output of the high level at the time $t_0$ to turn on the first switch $S_1$, and terminates the output of the high level at the time $t_1$ to turn off the first switch $S_1$. The driving square waves in the first period may be generated by using a timer or comparing the carrier waves.

When the first period is terminated, the current of the resonant inductor $L_r$ can be obtained by the following formula:

$$i_{Lr}(t_1) = \frac{VDD - VEE}{\beta L_r} e^{-\alpha t_1} \sin \beta t_1 \tag{1}$$

The voltages VDD and VEE of the power supply, the resistance $R_{g\text{-}in}$, the capacitance $C_{gs}$ and the inductance $L_r$ are fixed parameters of the circuit, and $t_1$ is a known quantity. A current $i_{Lr}(t_1)$ flowing through the resonant inductor at the time $t_1$ can be obtained by applying the parameters to the formula 1 by a designer or applying the parameters stored in a memory to a computation program. Further, $\alpha$ and $\beta$ can be calculated by the following formulas:

$$\alpha = \frac{R_{g\text{-}in}}{2L_r}; \beta = \sqrt{\frac{1}{L_r C_{gs}} - \alpha^2}$$

Before the second period, the current of the resonant inductor $L_r$ can be obtained by the following formula:

$$i_{Lr}(t) = i_{Lr}(t_1) - \frac{VDD - VEE}{L_r}(t - t_1), \text{ wherein } t_1 \leq t \tag{2}$$

The first threshold value or the second threshold value can be set according to the requirement of the designer or the user. Generally, the first threshold value and the second threshold value are close to zero. For example, the first threshold value ranges from 0.1 A to 1 A, and the second threshold value ranges from −1 A to −0.1 A. The absolute values of the first threshold value and the second threshold value can be the same or different. At the time $t_2$, the current flowing through the resonant inductor is equal to the first threshold value. Based on the above parameters and the first threshold value, the time $t_2$ at which the current of the resonant inductor is equal to the first threshold value is calculated. Specifically, $i_{Lr}(t_1)$ is calculated from the formula 1, $i_{Lr}(t_2)$ is equated to the first threshold value and the time $t_2$ is calculated from the formula 2.

From the time $t_2$, the current of the resonant inductor is freewheeled from the first threshold value through the upper diode (i.e., the diode $D_1$) of the second bridge arm and the first switch $S_1$, and is slowly decreased to zero. At this stage, the current of the resonant inductor can be approximately obtained by the following formula:

$$i_{Lr}(t) = \frac{V_{dson} + V_d}{L_r}(t - t_2), \text{ wherein } t_2 < t \leq t_3 \quad (3)$$

$V_{dson}$ is a drop-out of a turn-on voltage of the first switch $S_1$ and has a small value that can be neglected, and $V_d$ is a drop-out of a turn-on voltage of the diode $D_1$. The time $t_3$ at which the current of the resonant inductor crosses zero is calculated from the formula 3. The current $i_{Lr}(t_3)$ of the resonant inductor is equal to zero, $V_{dson}$, $V_d$ and $L_r$ are fixed parameters, and $t_2$ is calculated from the formula 2.

An initial time $t_4$ of the third period is calculated based on the switching period T and the duty cycle D of the power switch Q, and the time $t_4$ is equal to DT. The switching period T and the duty cycle D are known quantities. After calculating the times $t_2$, $t_3$ and $t_4$, the controller may initiate the output of the high level at the time $t_2$ to turn on the first switch $S_1$ again, and terminates the output of the high level at time $t_3$ or a time between $t_3$ and $t_4$ to turn off the first switch $S_1$ which has been turned on again. The driving square waves in the second period may be generated by using a timer or comparing the carrier waves.

The waves are generated in the third period and the fourth period in a similar way as in the first period and the second period. The duration of the third period can be set according to the model of the power switch Q and the desired switching speed (i.e., turn-off speed). That is, a length of the third period or the time $t_5$ can be set according to the requirement of the designer or the user. The controller initiates the output of the high level at the time $t_4$ to turn on the second switch $S_2$, and terminates the output of the high level at the time $t_5$ to turn off the second switch $S_2$. The driving square waves in the third period can be generated by using a timer or comparing the carrier waves.

When the third period is terminated at the time $t_5$, the current of the resonant inductor $L_r$ can be obtained by the following formula:

$$i_{Lr}(t_5) = \frac{-VDD + VEE}{\beta L_r} e^{-\alpha(t_5 - t_4)} \sin\beta(t_5 - t_4) \quad (4)$$

Before the fourth period, the current of the resonant inductor $L_r$ can be obtained by the following formula:

$$i_{Lr}(t) = -i_{Lr}(t_5) + \frac{VDD - VEE}{L_r}(t - t_5), \text{ wherein } t_5 \leq t \quad (5)$$

Based on the above parameters and the second threshold value, the time $t_6$ at which the current of the resonant inductor is equal to the second threshold value is calculated from the formulas 4 and 5.

From the time $t_6$, the current of the resonant inductor is freewheeled from the second threshold value through the lower diode (i.e., the diode $D_2$) of the second bridge arm and the second switch $S_2$, and is slowly increased to zero. At this stage, the current of the resonant inductor can be approximately obtained by the following formula:

$$i_{Lr}(t) = -\frac{V_{dson} + V_d}{L_r}(t - t_6), \text{ wherein } t_6 < t \leq t_7 \quad (6)$$

$V_{dson}$ is a drop-out of a turn-on voltage of the second switch $S_2$ and has a small value that can be neglected, and $V_d$ is a drop-out of a turn-on voltage of the diode $D_2$.

The time $t_7$ at which the current of the resonant inductor crosses zero is calculated from the formula 6. The current $i_{Lr}(t_7)$ of the resonant inductor is equal to zero. After the times $t_6$, $t_7$ and $t_8$ are calculated, the controller initiates the output of the high level at the time $t_6$ to turn on the second switch $S_2$ again, and terminates the output of the high level at the time $t_7$ or a time between $t_7$ and $t_8$ to turn off the second switch $S_2$ which has been turned on again. And the driving square waves in the fourth period can be generated by using a timer or comparing the carrier waves. The time $t_8$ is an end time of a current switching period, and is also an initial time of a next switching period.

In one embodiment, the driving device 100 of the invention may further comprise a control unit (not shown) electrically connected to the first switch $S_1$ and the second switch $S_2$. The control unit is configured to: calculate a time $t_{\alpha 1}$, such as the time $t_2$ of FIG. 4B, at which the current of the resonant inductor $L_r$ is decreased to the first threshold value according to a first inductance-current formula, such as formula 2; calculate a time $t_{\beta 1}$, such as the time $t_3$ of FIG. 4B, at which the current of the resonant inductor $L_r$ is decreased to zero according to a second inductance-current formula, such as formula 3; calculate a time $t_{\mu 1}$, such as the time $t_4$ of FIG. 4B, at which the second switch $S_2$ is turned on according to a duty cycle and a switching frequency $f_s$ of the power switch Q; turn on the first switch $S_1$ again when a time counted by an internal timer is equal to the time $t_{\alpha 1}$; and turn off the first switch $S_1$ when the time counted by the internal timer is a time in $[t_{\beta 1}, t_{\mu 1})$, thereby terminating the second period.

In another embodiment, the control unit is further configured to: calculate a time $t_{\alpha 2}$, such as the time $t_6$ of FIG. 4B, at which the current of the resonant inductor $L_r$ is increased to the second threshold value according to a third inductance-current formula, such as formula 5; calculate a time $t_{\beta 2}$, such as the time $t_7$ of FIG. 4B, at which the current of the resonant inductor $L_r$ is increased to zero according to a fourth inductance-current formula, such as formula 6; determine an initial time of a next switching period or an end time of a current switching period, such as the time $t_8$ of FIG. 4B; turn on the second switch $S_2$ again when a time counted by an internal timer is equal to the time $t_{\alpha 2}$; and turn off the second switch $S_2$ when the time counted by the internal timer is a time in $[t_{\beta 2}, t_8)$, thereby terminating the fourth period.

(Method 2) The current of the resonant inductor $L_r$ is sampled by a sensor, and a sampled value is inputted into a controller. The controller compares the sampled value with the first threshold value or the second threshold value to determine the time for outputting the driving square wave again.

In one embodiment, the driving device 100 may further comprise a sampling unit (not shown) electrically connected to the resonant inductor $L_r$ and a control unit (not shown) electrically connected to the first switch $S_1$ and the second switch $S_2$. The current of the resonant inductor $L_r$ is sampled by the sampling unit, and a sampled value is inputted into the control unit. The sampled value is compared with the first threshold value by the control unit, and when the sampled value is equal to the first threshold value, the control unit turns on the first switch $S_1$ again. The sampled value is compared with zero by the control unit, and when the sampled value is equal to zero, the control unit turns off the first switch $S_1$ and terminates the second period. Alternatively, the sampled value is compared with zero by the control unit, and when the sampled value is equal to zero, the control unit records a time $t_{\beta 1}$ counted by an internal timer. A turn-on time $t_{\mu 1}$ of the second switch $S_2$ is obtained by the control unit, and when the time counted by the internal timer is a time in $(t_{\beta 1}, t_{\mu 1})$, the control unit turns off the first switch $S_1$ and terminates the second period.

Further, in another embodiment, the current of the resonant inductor is sampled by the sampling unit, and a sampled value is inputted into the control unit. The sampled value is compared with the second threshold value by the control unit, and when the sampled value is equal to the second threshold value, the control unit turns on the second switch $S_2$ again. The sampled value is compared with zero by the control unit, and when the sampled value is equal to zero, the control unit turns off the second switch $S_2$ and terminates the fourth period. Alternatively, the sampled value is compared with zero are by the control unit, and when the sampled value is equal to zero, the control unit records a time $t_{\beta 2}$ counted by the internal timer. An initial time $t_0$ of the next switching period is obtained by the control unit, and when the time counted by the internal timer is a time in $(t_{\beta 2}, t_8)$, the control unit turns off the second switch $S_2$ and terminates the fourth period.

Figure 6:
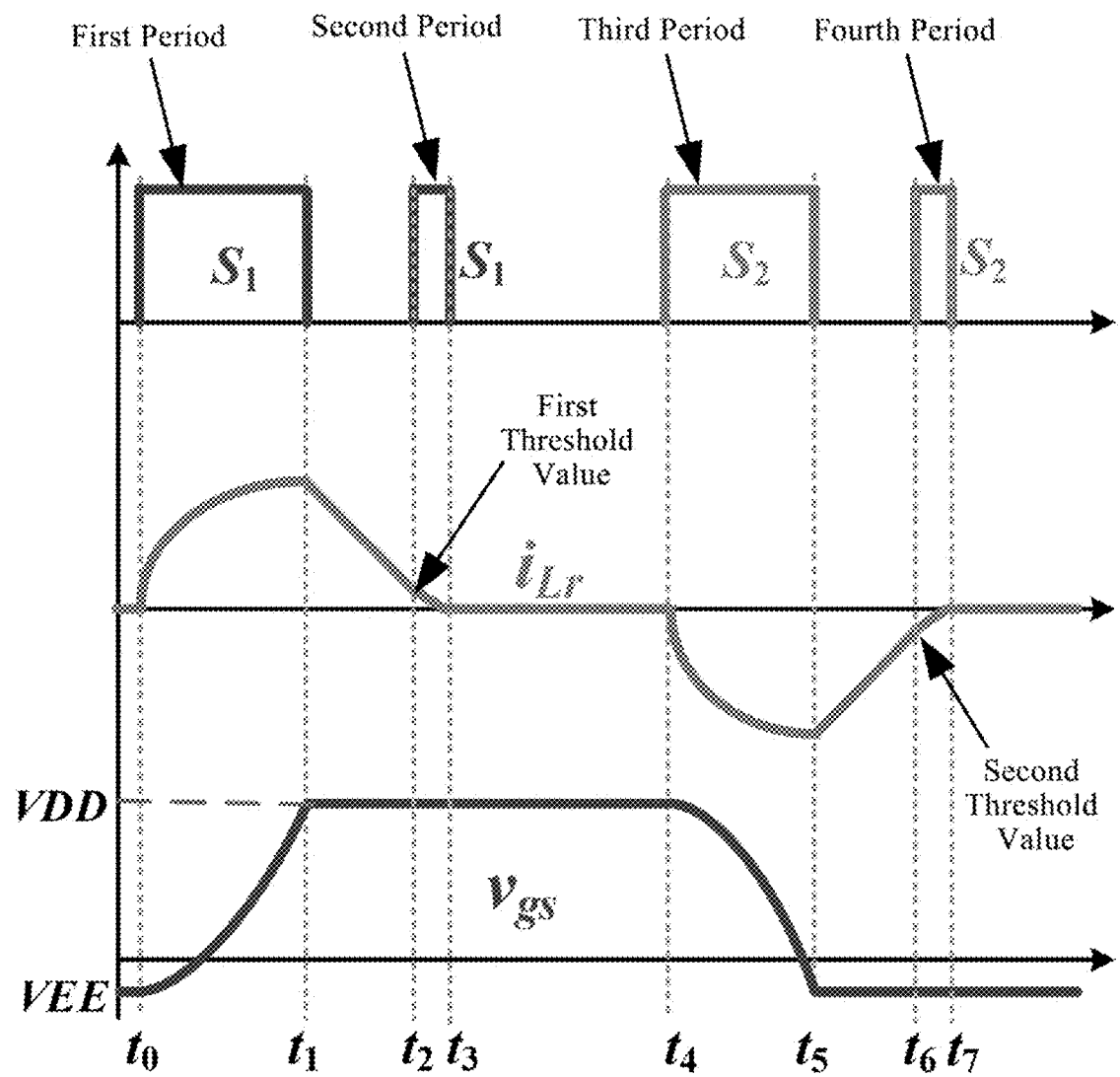
FIG. 6 shows working waveforms of the driving device of FIG. 4A according to another embodiment.

FIG. 6 shows working waveforms of the driving device 100 of FIG. 4A according to another embodiment. In this embodiment, the first switch $S_1$ which has been turned on again is turned off when the current of the resonant inductor $L_r$ is decreased to zero, and the second switch $S_2$ which has been turned on again is turned off when the current of the resonant inductor $L_r$ is increased to zero. When the current $i_{Lr}$ of the resonant inductor $L_r$ is decreased to a value close to zero, which is generally less than 1 A, the first switch $S_1$ is turned on again. When the current $i_{Lr}$ of the resonant inductor $L_r$ is zero, the first switch $S_1$ which has been turned on again is turned off. When the current $i_{Lr}$ of the resonant inductor $L_r$ is increased to a value close to zero, which is generally greater than −1 A, the second switch $S_2$ is turned on again. When the current $i_{Lr}$ of the resonant inductor $L_r$ is zero, the second switch $S_2$ which has been turned on again is turned off. In this embodiment, each of the first switch $S_1$ and the second switch $S_2$ is turned off when the current of the resonant inductor crosses zero, such that the second period and the fourth period are relatively short. As shown in FIG. 6, the high levels in the second period and the fourth period correspond to narrow pulses. Through the modulation method in this embodiment, each of the first switch $S_1$ and the second switch $S_2$ which has been turned on again is turned off as soon as possible, so the inherent leakage current path of the gate electrode G of the power switch Q can be cut off, and the turn-on loss of the driving circuit is further reduced.

In this embodiment, the driving device 100 can sample the current of the resonant inductor $L_r$ through the sampling unit, input the sampled value into the control unit, and compare the sampled value with the first threshold value (e.g., 1 A) through the control unit. When the sampled value is equal to the first threshold value, the control unit turns on the first switch $S_1$ again. The control unit compares the sampled value with zero, and when the sampled value is equal to zero, the control unit turns off the first switch $S_1$ and terminates the second period.

Further, in this embodiment, the driving device 100 can sample the current of the resonant inductor $L_r$ through the sampling unit, input the sampled value into the control unit, and compare the sampled value with the second threshold value (e.g., −1 A) through the control unit. When the sampled value is equal to the second threshold value, the control unit turns on the second switch $S_2$ again. The control unit compares the sampled value with zero, and when the sampled value is equal to zero, the control unit turns off the second switch $S_2$ and terminates the fourth period.

Figure 7:
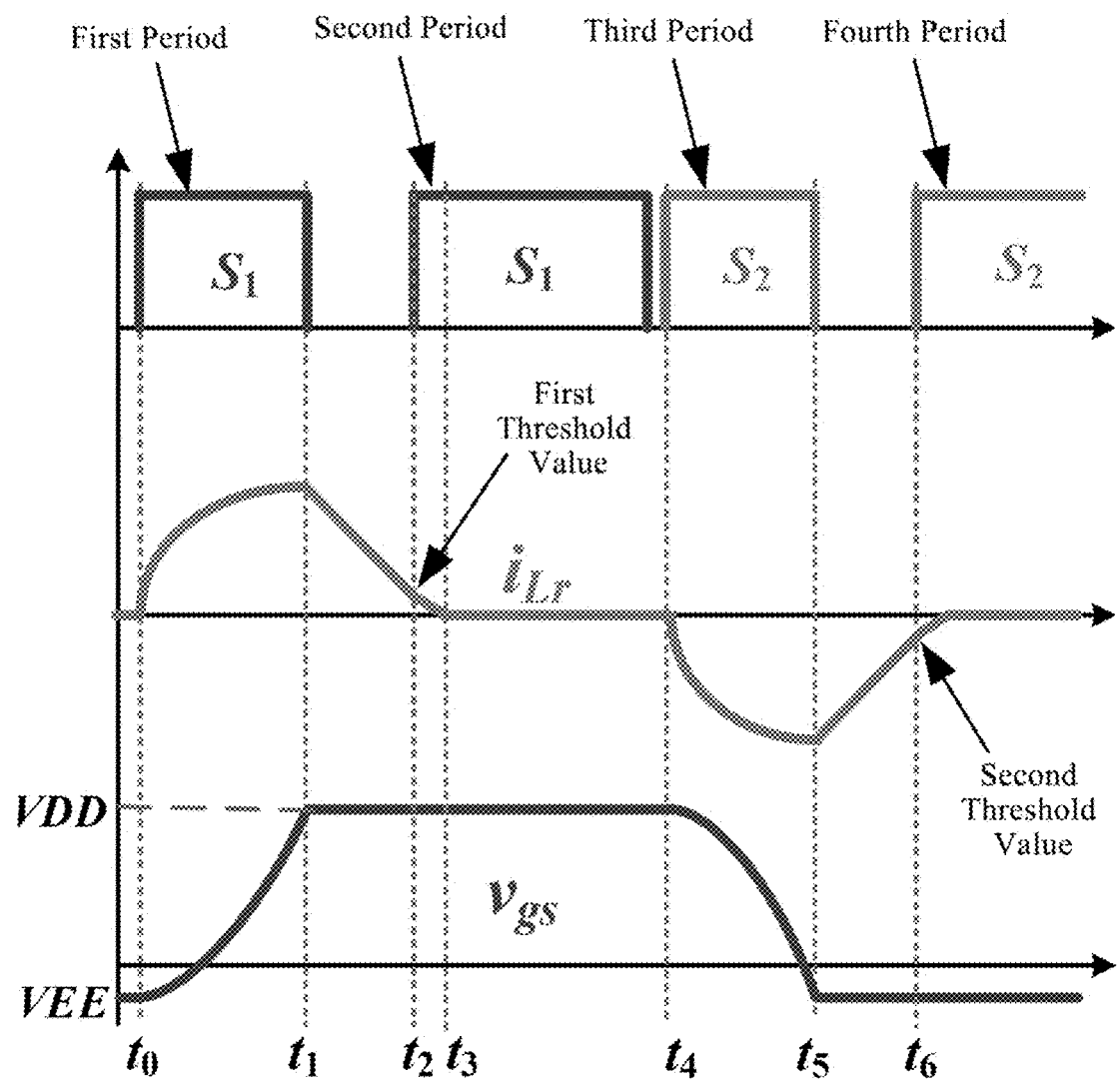
FIG. 7 shows working waveforms of the driving device of FIG. 4A according to further embodiment.

FIG. 7 shows working waveforms of the driving device 100 of FIG. 4A according to further one embodiment. In this embodiment, the first switch $S_1$ which has been turned on again is turned off before the second switch $S_2$ is turned on, and the second switch $S_2$ which has been turned on again is turned off before the first switch $S_1$ is turned on in the next switching period. When the current $i_{Lr}$ of the resonant inductor $L_r$ is decreased to a value close to zero, which is generally less than 1 A, the first switch $S_1$ is turned on again, and in a period for maintaining the driving voltage, the first switch $S_1$ keeps a turn-on state before the second switch $S_2$ is switched. When the current $i_{Lr}$ of the resonant inductor $L_r$ is increased to a value close to zero, which is generally greater than −1 A, the second switch $S_2$ is turned on again, and in a period for maintaining the driving voltage, the second switch $S_2$ keeps a turn-on state before the first switch $S_1$ is switched. In the second period and the fourth period, the gate electrode G of the power switch Q is connected to the power supply $V_{DD}/V_{EE}$ having a low internal resistance, such that the gate electrode G is low-resistance connected. In this embodiment, the gate electrode G of the power switch Q is connected to the power supply, such that the gate electrode G has a high stability and improved crosstalk resistant capability.

Figure 8A:
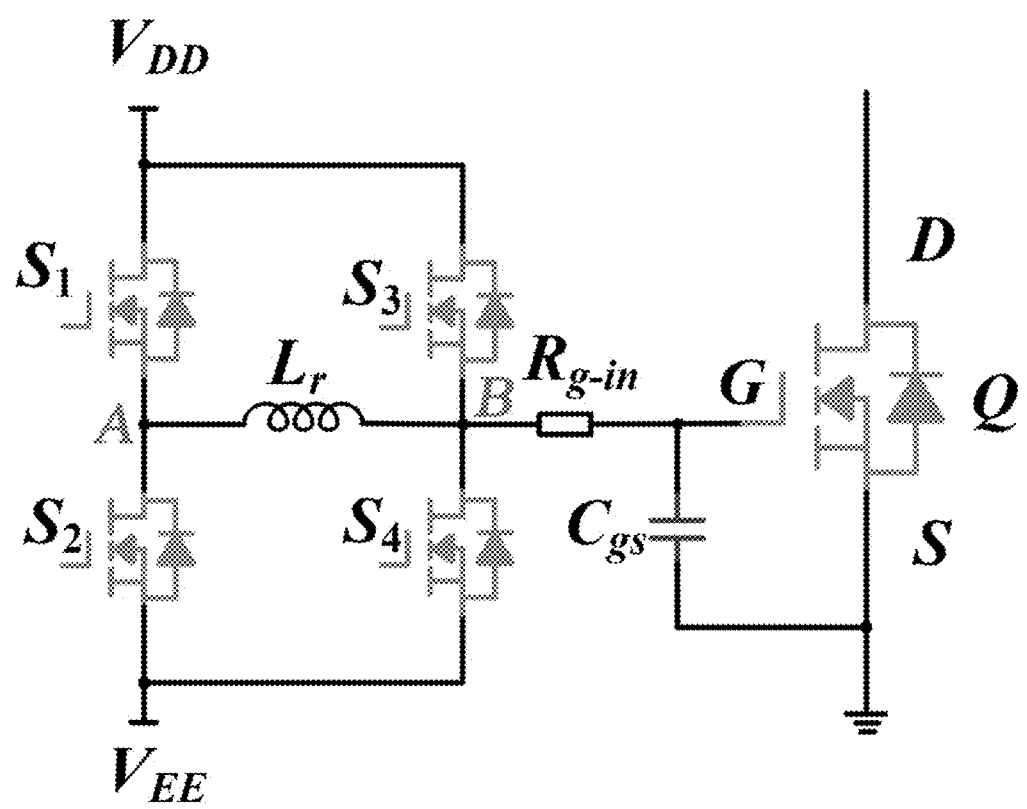
FIG. 8A shows a circuit topological structure of a driving device in a second preferable embodiment of the invention.
Figure 8B:
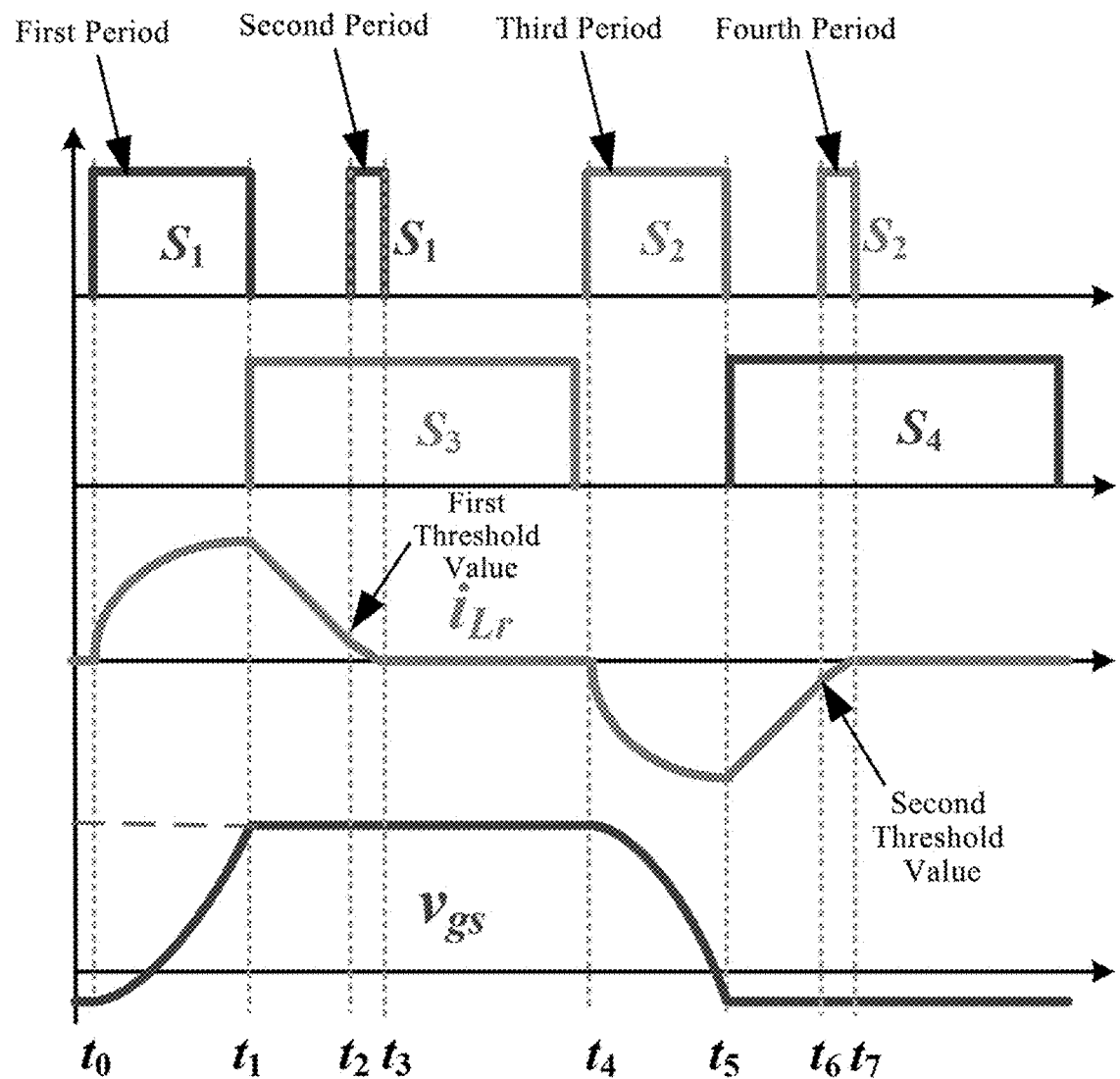
FIG. 8B shows working waveforms of the driving device of FIG. 8A.

FIG. 8A shows a circuit topological structure of a driving device in a second embodiment of the invention, and FIG. 8B shows working waveforms of the driving device of FIG. 8A. In the embodiment of FIG. 8A, the diode $D_1/D_2$ in the embodiment of FIG. 4A is replaced by a MOS transistor $S_3/S_4$. The MOS transistor $S_3$ is turned on at the time $t_1$ when the freewheeling of the resonant inductor $L_r$ begins, and the MOS transistor $S_3$ is turned off at a time prior to turning on the second switch $S_2$. The MOS transistor $S_4$ is turned on at the time $t_5$ when the freewheeling of the resonant inductor $L_r$ begins, and the MOS transistor $S_4$ is turned off at a time prior to turning on the first switch $S_1$. The freewheeling current flows through the MOS transistor $S_3$ and $S_4$, and the MOS transistor $S_3$ and $S_4$ operates in a synchronous rectifying manner. In a period for maintaining the driving voltage, the MOS transistor $S_3$ and $S_4$ keep the turn-on state, and the gate electrode G of the power switch Q is connected to the power supply $V_{DD}/V_{EE}$ having a low internal resistance through the MOS transistor $S_3/S_4$, such that the gate electrode G of the power switch Q is low-resistance connected. In this embodiment, the MOS transistor $S_3$ and $S_4$ operates in a synchronous rectifying manner, such that the turn-on loss of the driving circuit is further reduced. Moreover, the gate electrode G of the power switch Q is directly connected to the power supply without through the inductor, such that the stability is further improved, and the crosstalk resistant capability is improved.

As compared to the conventional method, the driving loss of the present invention is reduced because the resistor is replaced with the resonant inductor, and the resonant inductor feeds a portion of energy back to the power supply to reduce the loss of the driving circuit, and a portion of the loss in the circuit is irrelevant to the frequency. In the high frequency application, the driving loss can be further reduced by using the present invention.

Figure 9:
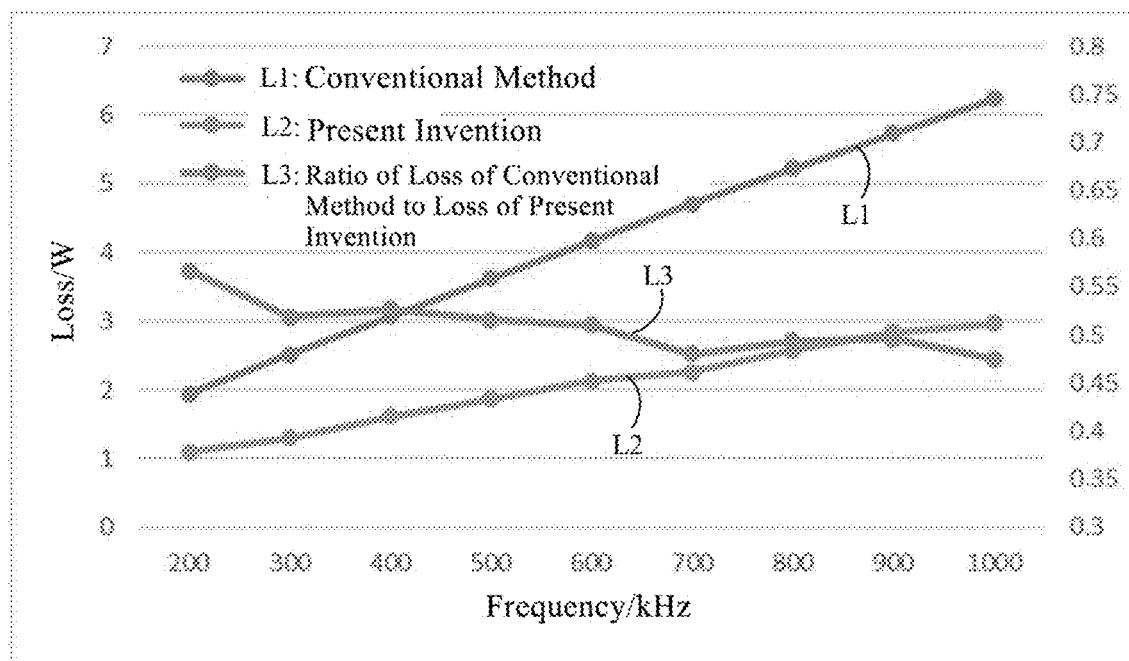
FIG. 9 shows a comparison of losses at different frequencies between the conventional method and the present invention.

FIG. 9 shows a comparison of losses at different frequencies between the conventional method and the present invention. As shown in FIG. 9, the driving loss in the present invention may be reduced by half as compared to the conventional method.

As compared to the conventional lossless driving method, the total loss of the driving circuit and the power switch is reduced, and the reliability is improved. In the present invention, the resonant source is removed from the resonant circuit by turning on the switch of a half-bridge arm again, thereby suppressing the oscillation; the oscillation does not occur in the driving voltage, so that a stable voltage is maintained in the switching process and the reliability of the gate electrode of the power switch is improved; the driving voltage can be the set voltage; and a turn-on resistance of the power switch can be maintained small, thereby further reducing the turn-on loss.

Figure 10A:
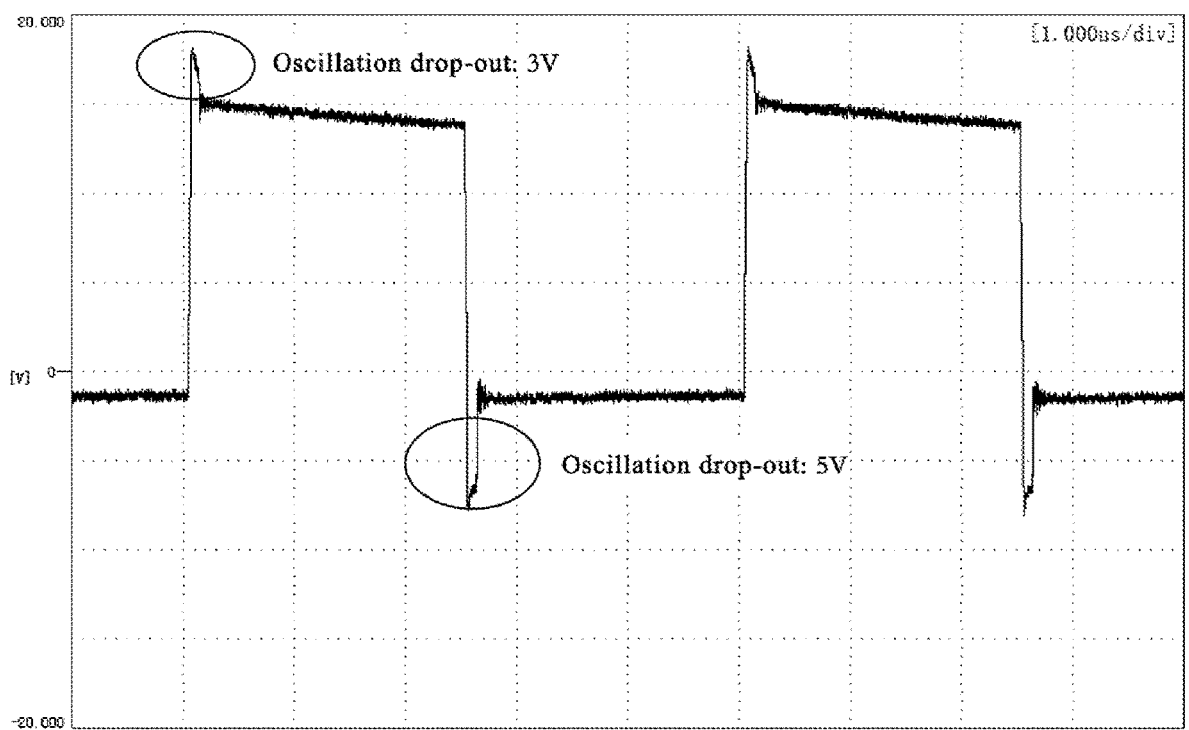
FIG. 10A shows a waveform of $V_{gs}$ measured in the conventional lossless driving method.
Figure 10B:
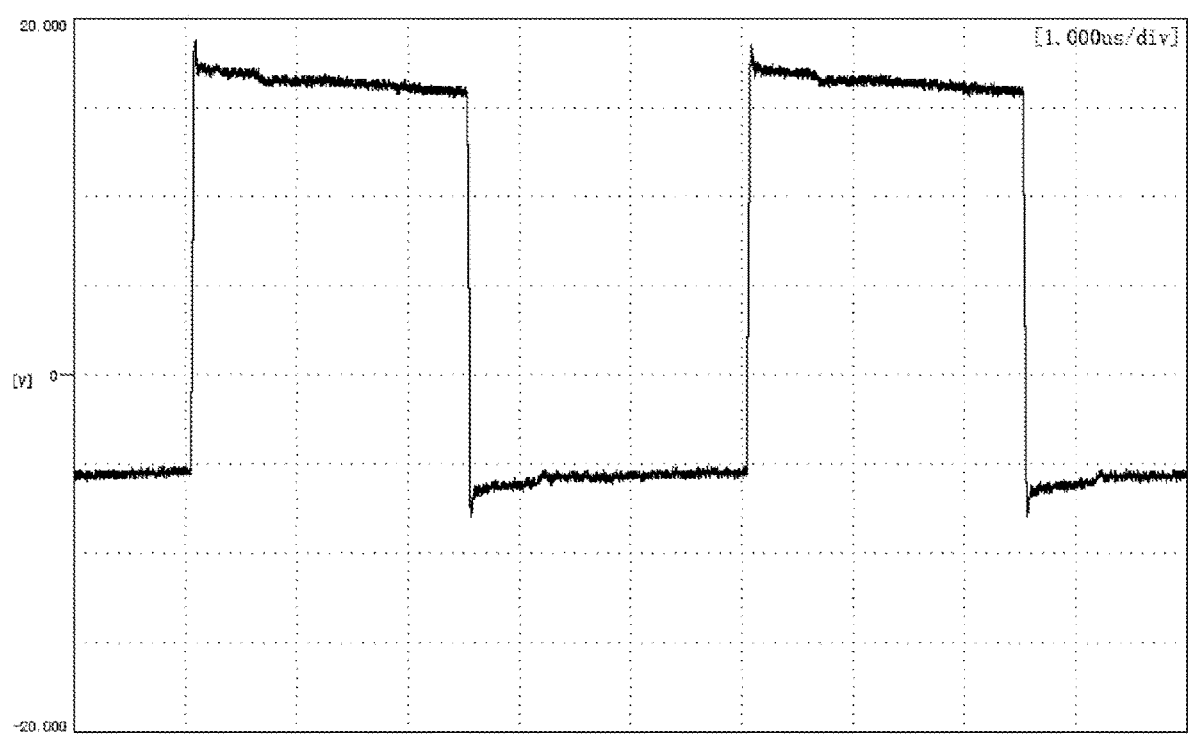
FIG. 10B shows a waveform of $V_{gs}$ measured in the present invention.

FIG. 10A shows a waveform of $V_{gs}$ measured in the conventional lossless driving method. As can be seen from FIG. 10A, the oscillation occurs in the driving voltage in the conventional lossless driving method. For example, the drop-out of the oscillation is 3V or 5V. If the set driving voltage is about 18V/−5V, the actual driving voltage changes to 15V/0V owing to the oscillation. FIG. 10B shows a waveform of $V_{gs}$ measured in the present invention. As can be seen from FIG. 10B, the present invention effectively suppresses the oscillation, and the driving voltage substantially keeps at about 18V/−5V.

Exemplary embodiments of the invention have been shown and described in details. It shall be understood that the invention is not limited to the disclosed embodiments. Instead, the invention intends to cover various modifications and equivalents included in the spirit and scope of the appended claims.

What is claimed is:

1. A method for controlling a driving device, the driving device configured to drive a power switch and comprising a power supply, a first bridge arm coupled to the power supply, a second bridge arm coupled in parallel to the first bridge arm, and a resonant inductor, the first bridge arm comprising a first switch and a second switch connected to a first midpoint, the second bridge arm comprising a first semiconductor element and a second semiconductor element connected to a second midpoint, the resonant inductor coupled between the first midpoint and the second midpoint, and the method comprising:

turning on the first switch for a first period such that the power supply charges a gate electrode of the power switch; and turning on the first switch again for a second period in response to a decrease of a current of the resonant inductor to a first threshold value, such that a potential of the first midpoint is equal to a potential of the second midpoint.

2. The method of claim 1, further comprising:

turning on the second switch for a third period to discharge the gate electrode of the power switch; and turning on the second switch again for a fourth period in response to an increase the current of the resonant inductor to a second threshold value, thereby the potential of the first midpoint being equal to the potential of the second midpoint.

3. The method of claim 2, wherein the power supply comprises a first power supply coupled to the first switch and a second power supply coupled to the second switch, wherein, in the second period, the potential of the first midpoint is clamped by the first switch to a voltage of the first power supply, and the potential of the second midpoint is equal to the voltage of the first power supply, and in the fourth period, the potential of the first midpoint is clamped by the second switch to a voltage of the second power supply, and the potential of the second midpoint is equal to the voltage of the second power supply.

4. The method of claim 2, wherein the first switch turned on again is turned off when the current of the resonant inductor is decreased to zero, and the second switch turned on again is turned off when the current of the resonant inductor is increased to zero.

5. The method of claim 2, wherein the first switch turned on again is turned off before the second switch is turned on, and the second switch turned on again is turned off before the first switch is turned on in a next switching period.

6. The method of claim 1, further comprising:

calculating a time $t_{\alpha 1}$ at which the current of the resonant inductor is decreased to the first threshold value according to a first inductance-current formula;

calculating a time $t_{\beta 1}$ at which the current of the resonant inductor is decreased to zero according to a second inductance-current formula;

calculating a time $t_{\mu 1}$ at which the second switch is turned on according to a duty cycle and a switching frequency of the power switch;

turning on the first switch again when a time counted by an internal timer is equal to the time $t_{\alpha 1}$; and turning off the first switch when the time counted by the internal timer is a time in $[t_{\beta 1}, t_{\mu 1})$.

7. The method of claim 2, further comprising:

calculating a time $t_{\alpha 2}$ at which the current of the resonant inductor is increased to the second threshold value according to a third inductance-current formula;

calculating a time $t_{\beta 2}$ at which the current of the resonant inductor is increased to zero according to a fourth inductance-current formula;

determining an ending time $t_8$ of a current switching period;

turning on the second switch again when a time counted by an internal timer is equal to the time $t_{\alpha 2}$; and turning off the second switch when the time counted by the internal timer is a time in $[t_{\beta 2}, t_8)$.

8. The method of claim 1, further comprising:
obtaining the current of the resonant inductor;
comparing an obtained value with the first threshold value, and turning on the first switch again when the obtained value is equal to the first threshold value; and
comparing the obtained value with zero, and turning off the first switch when the obtained value is equal to zero.

9. The method of claim 1, further comprising:
obtaining the current of the resonant inductor;
comparing an obtained value with the first threshold value, and turning on the first switch again when the obtained value is equal to the first threshold value;
comparing the obtained value with zero, and recording a time $t_{\beta 1}$ counted by an internal timer when the obtained value is equal to zero; and
obtaining a turn-on time $t_{\mu 1}$ of the second switch, and turning off the first switch when the time counted by the internal timer is a time in $(t_{\beta 1}, t_{\mu 1})$.

10. The method of claim 2, further comprising:
obtaining the current of the resonant inductor;
comparing an obtained value with the second threshold value, and turning on the second switch again when the obtained value is equal to the second threshold value; and
comparing the obtained value with zero, and turning off the second switch when the obtained value is equal to zero.

11. The method of claim 2, further comprising:
obtaining the current of the resonant inductor;
comparing an obtained value with the second threshold value, and turning on the second switch again when the obtained value is equal to the second threshold value;
comparing the obtained value with zero, and recording a time $t_{\beta 2}$ counted by an internal timer when the obtained value is equal to zero; and
obtaining an ending time $t_8$ of a current switching period, and turning off the second switch when the time counted by the internal timer is a time in $(t_{\beta 2}, t_8)$.

12. The method of claim 2, wherein the first threshold value is in a range of $(0, 1 A]$, and the second threshold value is in a range of $[-1 A, 0)$.

13. A device for driving a power switch, comprising:
a power supply;
a first bridge arm coupled to the power supply, and comprising a first switch and a second switch connected to a first midpoint;
a second bridge arm coupled in parallel to the first bridge arm, and comprising a first semiconductor element and a second semiconductor element connected to a second midpoint; and
a resonant inductor coupled between the first midpoint and the second midpoint;
wherein the first switch is turned on for a first period such that the power supply charges a gate electrode of the power switch; and in response to a decrease of a current of the resonant inductor to a first threshold value, the first switch is turned on again for a second period such that a potential of the first midpoint is equal to a potential of the second midpoint.

14. The device of claim 13, wherein the second switch is turned on for a third period to discharge the gate electrode of the power switch; and in response to an increase of the current of the resonant inductor to a second threshold value, the second switch is turned on again for a fourth period such that the potential of the first midpoint is equal to the potential of the second midpoint.

15. The device of claim 14, wherein the power supply comprises a first power supply coupled to the first switch and a second power supply coupled to the second switch,
wherein, in the second period, the potential of the first midpoint is clamped by the first switch to a voltage of the first power supply, and the potential of the second midpoint is equal to the voltage of the first power supply, and
in the fourth period, the potential of the first midpoint is clamped by the second switch to a voltage of the second power supply, and the potential of the second midpoint is equal to the voltage of the second power supply.

16. The device of claim 14, wherein the first switch turned on again is turned off when the current of the resonant inductor is decreased to zero, and the second switch turned on again is turned off when the current of the resonant inductor is increased to zero.

17. The device of claim 14, wherein the first switch turned on again is turned off before the second switch is turned on, and the second switch turned on again is turned off before the first switch is turned on in a next switching period.

18. The device of claim 13, further comprising a control unit electrically connected to the first switch and the second switch and configured to:
calculate a time $t_{\alpha 1}$ at which the current of the resonant inductor is decreased to the first threshold value according to a first inductance-current formula;
calculate a time $t_{\beta 1}$ at which the current of the resonant inductor is decreased to zero according to a second inductance-current formula;
calculate a time $t_{\mu 1}$ at which the second switch is turned on according to a duty cycle and a switching frequency of the power switch;
turn on the first switch again when a time counted by an internal timer is equal to the time $t_{\alpha 1}$; and
turn off the first switch when the time counted by the internal timer is a time in $[t_{\beta 1}, t_{\mu 1})$.

19. The device of claim 14, further comprising a control unit electrically connected to the first switch and the second switch and configured to:
calculate a time $t_{\alpha 2}$ at which the current of the resonant inductor is increased to the second threshold value according to a third inductance-current formula;
calculate a time $t_{\beta 2}$ at which the current of the resonant inductor is increased to zero according to a fourth inductance-current formula;
determine an ending time $t_8$ of a current switching period;
turn on the second switch again when a time counted by an internal timer is equal to the time $t_{\alpha 2}$; and
turn off the second switch when the time counted by the internal timer is a time in $[t_{\beta 2}, t_8)$.

20. The device of claim 13, further comprising a control unit electrically connected to the first switch and the second switch, and a sampling unit electrically connected to the resonant inductor and the control unit, wherein,
the sampling unit is configured to obtain the current of the resonant inductor; and
the control unit is configured to:
receive an obtained value;
compare the obtained value with the first threshold value, and turn on the first switch again when the obtained value is equal to the first threshold value; and compare the obtained value with zero, and turn off the first switch when the obtained value is equal to zero.

21. The device of claim 13, further comprising a control unit electrically connected to the first switch and the second switch, and a sampling unit electrically connected to the resonant inductor and the control unit, wherein, the sampling unit is configured to obtain the current of the resonant inductor; and the control unit is configured to:

receive an obtained value;

compare the obtained value with the first threshold value, and turn on the first switch again when the obtained value is equal to the first threshold value;

compare the obtained value with zero, and record a time $t_{\beta 1}$ counted by an internal timer when the obtained value is equal to zero; and obtain a turn-on time $t_{\mu 1}$ of the second switch, and turn off the first switch when the time counted by the internal timer is a time in $(t_{\beta 1}, t_{\mu 1})$.

22. The device of claim 14, further comprising a control unit electrically connected to the first switch and the second switch, and a sampling unit electrically connected to the resonant inductor and the control unit, wherein, the sampling unit is configured to obtain the current of the resonant inductor; and the control unit is configured to:

receive an obtained value;

compare the obtained value with the second threshold value, and turn on the second switch again when the obtained value is equal to the second threshold value; and compare the obtained value with zero, and turn off the second switch when the obtained value is equal to zero.

23. The device of claim 14, further comprising a control unit electrically connected to the first switch and the second switch, and a sampling unit electrically connected to the resonant inductor and the control unit, wherein, the sampling unit is configured to obtain the current of the resonant inductor; and the control unit is configured to:

receive an obtained value;

compare the obtained value with the second threshold value, and turn on the second switch again when the obtained value is equal to the second threshold value;

compare the obtained value with zero, and record a time $t_{\beta 2}$ counted by an internal timer when the obtained value is equal to zero; and obtain an ending time $t_8$ of a current switching period, and turn off the second switch when the time counted by the internal timer is a time in $(t_{\beta 2}, t_8)$.

* * * * *